United States Patent
Min et al.

(10) Patent No.: US 8,247,291 B2
(45) Date of Patent: Aug. 21, 2012

(54) METHODS OF FORMING FINE PATTERNS IN INTEGRATED CIRCUIT DEVICES AND METHODS OF MANUFACTURING INTEGRATED CIRCUIT DEVICES INCLUDING THE SAME

(75) Inventors: Jae-Ho Min, Seoul (KR); Young-Ju Park, Seoul (KR); Myeong-Cheol Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/009,298

(22) Filed: Jan. 19, 2011

(65) Prior Publication Data

US 2011/0183505 A1 Jul. 28, 2011

(30) Foreign Application Priority Data

Jan. 28, 2010 (KR) ........................ 10-2010-0007672

(51) Int. Cl.
 *H01L 21/74* (2006.01)

(52) U.S. Cl. ................................ 438/257; 257/E21.538

(58) Field of Classification Search .................. 257/401, 257/E21.209, E21.422, E21.538; 438/257–259, 438/586
See application file for complete search history.

(56) References Cited

U.S. PATENT DOCUMENTS

| 7,115,525 B2 | 10/2006 | Abatchev et al. |
| 7,339,242 B2 * | 3/2008 | Cho et al. ...................... 257/401 |
| 2009/0117739 A1 * | 5/2009 | Shin et al. ..................... 438/690 |
| 2010/0055914 A1 * | 3/2010 | Min et al. ...................... 438/700 |

FOREIGN PATENT DOCUMENTS

| KR | 1020060113162 A | 11/2006 |
| KR | 100843236 B1 | 6/2008 |
| KR | 100874433 B1 | 12/2008 |

* cited by examiner

*Primary Examiner* — Julio J Maldonado
*Assistant Examiner* — Daniel Shook
(74) *Attorney, Agent, or Firm* — Myers Bigel Sibley & Sajovec, P.A.

(57) ABSTRACT

A method of fabricating an integrated circuit device includes forming first and second preliminary mask structures on a hard mask layer in respective first and second regions of the substrate. Spacers are formed on opposing sidewalls of the first and second preliminary mask structures, and the first preliminary mask structure is selectively removed from between the spacers in the first region. The hard mask layer is etched using the spacers and the second preliminary mask structure as a mask to define a first mask pattern including the opposing sidewall spacers with a void therebetween in the first region and a second mask pattern including the opposing sidewall spacers and the second preliminary mask structure therebetween in the second region. An insulation layer is patterned using the first and second mask patterns as respective masks to define a first trench in the first region and a second trench in the second region having a greater width than the first trench, and first and second conductive patterns are formed in the first and second trenches.

17 Claims, 22 Drawing Sheets

METHODS OF FORMING FINE PATTERNS IN INTEGRATED CIRCUIT DEVICES AND METHODS OF MANUFACTURING INTEGRATED CIRCUIT DEVICES INCLUDING THE SAME

CROSS-REFERENCE TO RELATED APPLICATIONS

This application claims the benefit of Korean Patent Application No. 10-2010-0007672 filed on Jan. 28, 2010, in the Korean Intellectual Property Office, the disclosure of which is incorporated by reference herein in its entirety.

BACKGROUND

1. Field

Example embodiments relate to methods of forming a wiring structure for integrated circuit devices and methods of manufacturing non-volatile semiconductor devices having the same, and more particularly, to methods of forming the wiring structure by a spacer patterning process and methods of manufacturing non-volatile semiconductor devices using the same.

2. Description of the Related Art

As the degree of integration of integrated circuit devices increases, conductive structures and wiring structures may be downsized and/or become more dense. The downsizing of the structures usually reduces the cross sectional area of the wiring structure and thus increases electrical resistance in the wiring structures of the semiconductor devices. In addition, the high density of the structures on a substrate usually causes a RC delay (resistance-capacitance delay) and an electronic interference between neighboring conductive structures and wiring structures of the semiconductor devices. Thus, the high degree of the integration may increase failures of the devices, and various research has been conducted for reducing device failures in parallel with studies for increasing the degree of integration.

For example, it has been suggested that copper (Cu) having a relatively low electrical resistance may be used for a wiring material and a low-k dielectric material having a relatively low dielectric constant may be used for an insulation interlayer.

Particularly, copper (Cu) may offer advantages of higher electrical conductivity and lower electro-migration as compared with aluminum (Al), which has been most widely used as a wiring structure in semiconductor devices. Thus, the low resistance property of the copper (Cu) may reduce an RC delay of the wiring structure to thereby reduce and/or minimize the reduction of the operation speed and power consumption of the semiconductor device. In addition, the lower electro-migration of the copper (Cu) may reduce and/or minimize the process limitations and reduce process failures of the semiconductor device, to thereby increase production yield of the semiconductor device.

However, copper (Cu) may present difficulties in patterning through conventional patterning processes including deposition processes for forming a thin layer and etching processes for etching the thin layer. For those reasons, a damascene process has been used for forming a copper pattern in which a recessed portion corresponding to the wiring structure is firstly formed in an insulation interlayer and the recessed pattern is filled with copper (Cu). That is, an insulation interlayer is first patterned to have an opening portion such as a via-hole and a trench therein, and a copper layer is formed on the insulation interlayer to a sufficient thickness to fill up the opening. Then, the copper layer may be removed from the insulation interlayer by a planarization process until a top surface of the insulation interlayer is exposed and thus the copper layer remains in the opening to form the copper wiring structure.

The above conventional damascene process may become more difficult to perform as the degree of integration of a semiconductor device increases. Conventionally, the recessed pattern having the via-hole or the trench is usually formed in the insulation interlayer by a photolithography process using a photolithography pattern on the insulation interlayer as a mask pattern. However, it may be difficult to form fine patterns in the insulation interlayer due to the resolution limitations of the lithography apparatus. In particular, it may be difficult to form fine patterns having a critical dimension (CD) of less than about 40 nm, because the theoretical CD limit for the photolithography process may be about 46 nm. Therefore, the conductive structures such as gate lines and wiring structure for recent very high integrated semiconductor device may be very difficult to form using present photolithography apparatus.

Accordingly, a double patterning technology (DPT) or a spacer patterning technology (SPT) has been suggested for forming fine patterns having a CD of less than the minimum resolution of the photolithography apparatus through consecutive photolithography processes.

In a conventional structure of the semiconductor devices, memory cells including conductive structures and wiring structures may be arranged in a cell area of a chip, and peripheral circuits for applying an electrical power and/or control signals to the memory cells may be arranged in a peripheral/core area of the chip, and a line width of a pattern in the cell area may be different from that of a pattern in the peripheral/core area. Based on the conventional structure of the semiconductor device, the DPT or the SPT performs a double exposure using a first mask pattern having a relatively small pitch and a second mask pattern having a pitch larger than that of the first mask pattern. Therefore, a first pattern having a relatively small line width or a relatively small interval is formed in the cell area of a substrate by a first photolithography process using the first mask pattern and a second pattern having a relatively large line width or a relatively large interval is formed in the peripheral/core cell area of a substrate by a second photolithography process using the second mask pattern. The DPT or the SPT process is usually performed in such a way that the first pattern has a line width smaller than the marginal resolution of the photolithography apparatus simultaneously with the second pattern of which the line width is larger than the marginal resolution of the photolithography apparatus. Therefore, the conductive structures and the wiring structures of which the line widths are varied to be smaller or larger than the marginal resolution (for example, in accordance with the cell area and the peripheral/core area) may be formed on the substrate simultaneously with each other by the DPT or the SPT process.

However, when the mask patterns used in the first and the second photolithography processes are not properly positioned on the substrate, the conductive structures or the wiring structures including both of the first and second patterns cannot be formed on the substrate. For example, in a cell area of a NAND flash memory device in which a plurality of bit lines is arranged between a string selection line (SSL) and a ground selection line (GSL), it may be describable to form each of the bit lines as a fine pattern having a line width smaller than the marginal resolution of the photolithography apparatus. Also, a node separation pattern connected to a group of the bit lines at end portions thereof may be formed into a normal pattern having a line width larger than the marginal resolution of the photolithography apparatus. Thus, the bit lines of the NAND flash memory device may be formed in the cell area of the substrate by a first damascene process using the first mask pattern, and the node separation patterns may be formed in the same cell area of the substrate by a second damascene process using the second mask pattern in a similar manner as the photolithography process for forming the wiring structures in the peripheral/core area of the substrate.

In such a case, when a first damascene position to which the first photolithography process is performed using the first mask pattern is not aligned with a second damascene position to which the second photolithography process is performed using the second mask pattern, the bit lines may not be connected to a proper node separation pattern. Thus, the bit lines neighboring to each other may make contact with each other.

Further, a spacer pattern for forming the first pattern in the cell area may be damaged in a second etching process using the second mask pattern as an etching mask in the peripheral/core area of the substrate. In a conventional DPT or SPT process, the spacer pattern may be formed in the cell area of the substrate by a first etching process using the first mask pattern as an etching mask, and then a supplementary mask pattern for forming the second pattern may be formed in the peripheral/core area by the second etching process. Thus, the spacer pattern in the cell area may be damaged in the second etching process, and the first damascene process using the spacer pattern as an etching may be insufficiently performed. For those reasons, the widths of the via-holes or the trenches may become non-uniform and thus the line widths the bit lines, which are usually formed in the via-holes or the trenches, may also become non-uniform.

SUMMARY

Example embodiments provide a method of forming a wiring structure for a semiconductor device by an SPT using a single photolithography process and a single mask pattern.

Other example embodiments provide a method of manufacturing a non-volatile memory device having the above wiring structure.

According to some example embodiments, there is provided a method of fabricating an integrated circuit device. A substrate including an insulation layer and a hard mask layer thereon is provided, and first and second preliminary mask structures are formed on the hard mask layer in respective first and second regions of the substrate. The second preliminary mask structure has a greater width than the first preliminary mask structure. Spacers are formed on opposing sidewalls of the first and second preliminary mask structures. The first preliminary mask structure is selectively removed from between the spacers in the first region such that the second preliminary mask structure remains between the spacers in the second region. The hard mask layer is etched using the spacers and the second preliminary mask structure as a mask to define a first mask pattern including the opposing sidewall spacers with a void therebetween in the first region, and a second mask pattern including the opposing sidewall spacers and the second preliminary mask structure therebetween in the second region. The insulation layer is patterned using the first mask pattern as a mask to define a first trench in the first region and using the second mask pattern as a mask to define a second trench in the second region having a greater width than the first trench. First and second conductive patterns are formed in the first and second trenches, respectively.

In an example embodiment, each of the first and second preliminary mask structures may include a sacrificial pattern and a dummy pattern thereon. The dummy pattern may have an etch selectivity relative to the sacrificial pattern. The spacers may be formed by conformally forming a spacer layer on upper surfaces and on the opposing sidewalls of the first and second preliminary mask structures, and anisotropically etching the spacer layer on the upper surfaces of the first and second preliminary mask structures to remove spacer layer therefrom and to remove the dummy pattern from the first preliminary mask structure while maintaining at least a portion of the dummy pattern of the second preliminary mask structure.

In an example embodiment, the first and second preliminary mask structures may be formed by providing a sacrificial layer and a dummy layer on the hard mask layer, and patterning the dummy layer using respective masks to define the respective dummy patterns of the first and second preliminary mask structures in the first and second regions. The sacrificial layer may be isotropically etched using the respective dummy patterns as masks to define the respective sacrificial patterns of the first and second preliminary mask structures and such that a greater portion of the dummy pattern of the first preliminary mask structure is removed as compared to the dummy pattern of the second preliminary mask structure.

In an example embodiment, the sacrificial layer may be at least one of a silicon-containing layer and a carbon-containing layer.

In an example embodiment, the first preliminary mask structure may be selectively removed by, after anisotropically etching the spacer layer, selectively etching the first and second preliminary mask structures using the portion of the dummy pattern of the second preliminary mask structure as a mask to remove the sacrificial pattern of the first preliminary mask structure without substantially removing the second preliminary mask structure.

In an example embodiment, a plurality of the first preliminary mask structures may be formed on the first region, and the spacers may have a width that is less than one half of a difference between a pitch of the first preliminary mask structures and the width of the first preliminary mask structures.

In an example embodiment, a plurality of the first conductive patterns may be formed in respective first trenches in the insulation layer in the first region, and the spacers may have a width that is less than about half of a width of the first conductive patterns.

In an example embodiment, the first region may be a memory cell active region, and the second region may be a peripheral circuit region.

In an example embodiment, the insulation layer may include a lower insulation layer, an etch stop layer, and an upper insulation layer sequentially stacked on the substrate.

According to further example embodiments of the present inventive concept, a method of manufacturing a non-volatile memory device includes forming a string selection line (SSL), a ground selection line (GSL) and a number of word lines (WL) between the SSL and the GSL extending parallel in a second direction on a substrate that has a number of active regions extending in a first direction perpendicular to the second direction. An insulation layer is formed on the substrate and on the string selection line, the ground selection line, and the word lines therebetween. The insulation layer includes a first insulation interlayer, an etch stop layer, and a second insulation interlayer thereon, and further includes a conductive plug extending therethrough to contact an active region. A hard mask layer is formed on the second insulation interlayer, and first and second preliminary mask structures are formed on the hard mask layer in a cell region and a peripheral region of the substrate, respectively. The second preliminary mask structure has a greater width than the first preliminary mask structure. Spacers are formed on opposing sidewalls of the first and second preliminary mask structures, and the first preliminary mask structure is selectively removed from between the spacers in the cell region such that the second preliminary mask structure remains between the spacers in the peripheral region. The hard mask layer is etched using the spacers and the second preliminary mask structure as a mask to define a first mask pattern comprising the opposing sidewall spacers with a void therebetween in the cell region and a second mask pattern comprising the opposing sidewall spacers and the second preliminary mask structure therebetween in the peripheral region. The insulation layer is patterned using the first mask pattern as a mask to define a first trench in the cell region that exposes the conductive plug and using the second mask pattern as a mask to define a peripheral trench in the peripheral region having a greater width than the first trench. A bit line is formed in the first trench, and a peripheral wiring structure is formed in the peripheral trench.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Example embodiments will be more clearly understood from the following detailed description taken in conjunction with the accompanying drawings.

DETAILED DESCRIPTION OF EMBODIMENTS

Figure 1A:
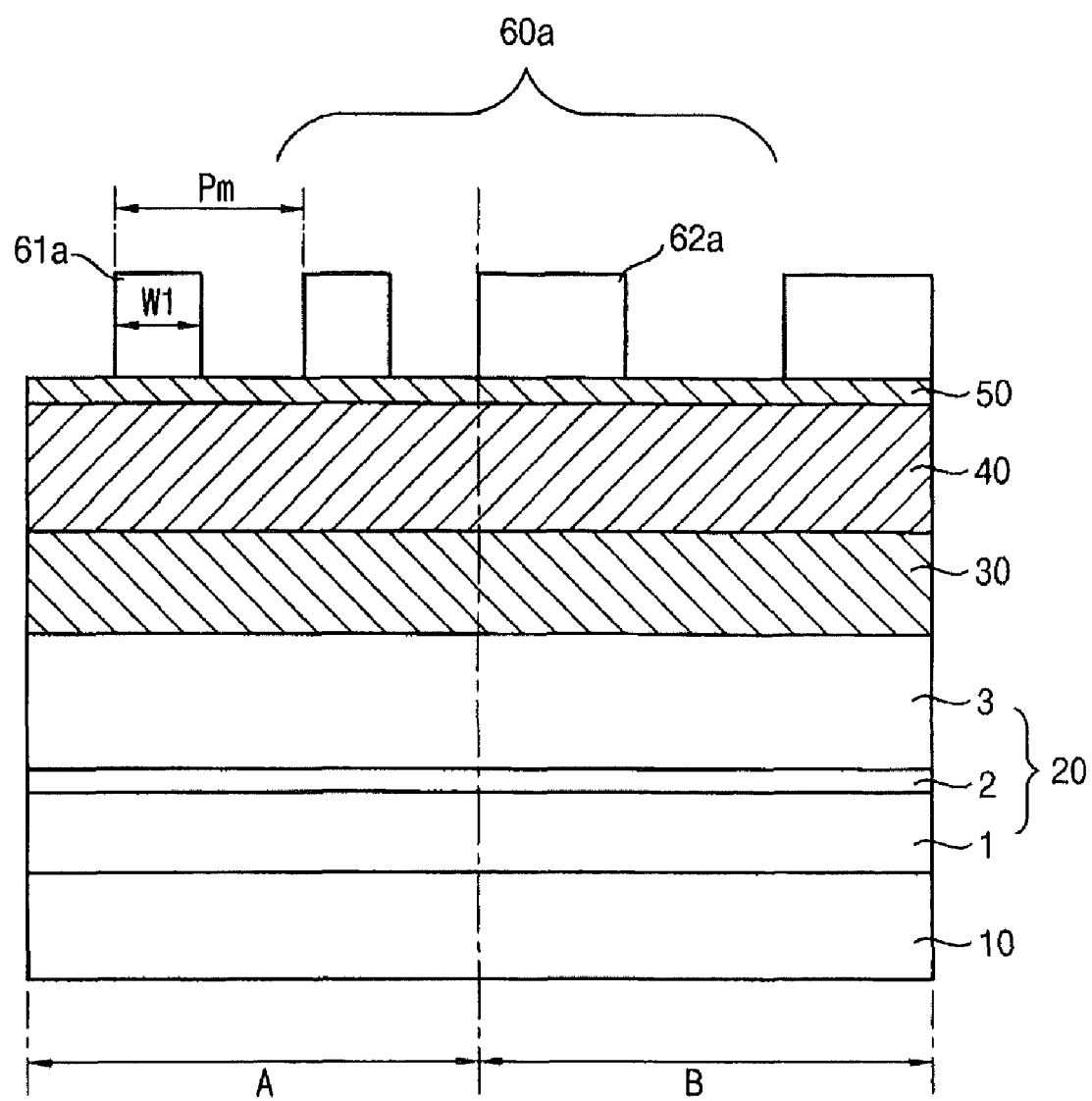
FIGS. 1A to 1H are cross-sectional views illustrating processing steps for methods of forming a wiring structure in accordance with some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Method of Forming a Wiring Structure for a Semiconductor Device

FIGS. 1A to 1H are cross-sectional views illustrating processing steps for a method of forming a wiring structure for a semiconductor device in accordance with an example embodiment of the present inventive concept. In the present example embodiment, a hard mask pattern for forming the wiring structure may have different sizes in accordance with local areas of a substrate. However, the hard mask pattern may be obtained by a DPT or a SPT using a single photo mask pattern, as will be described hereinafter.

Referring to FIG. 1A, a substrate 10 having a first area A and a second area B may be prepared and an insulation layer 20, a hard mask layer 30, a sacrificial layer 40, a dummy or variable mask layer 50 and a mask pattern 60a may be sequentially stacked on the substrate 10. In the present example embodiment, the mask pattern 60a on the dummy mask layer 50 may have different line widths in the first area A and the second area B according to line widths of the wiring structures in the respective first and second areas A and B.

For example, the substrate 10 may include a semiconductor substrate, such as a silicon wafer, and a plurality of conductive structures such as gate structures may be arranged on the substrate 10. Thus, the first area A of the substrate 10 may include a cell array area in which a plurality of unit memory devices is arranged and the second area B may include a peripheral or a core area in which a number of peripheral circuits for driving the memory devices in the cell area may be arranged.

A first pattern having a first line width and a first gap distance may be arranged in the first area A of the substrate 10 and a second pattern having a second line width larger than the first line width may be arranged in the second area B of the substrate 10. The first and the second line widths and the first gap distance may be varied in accordance with characteristics and kinds of the semiconductor device having the wiring structures. Thus, the first pattern having a relatively small line width may be densely formed in the first area A and the second pattern having a relatively large line width may be less densely formed in the second area B.

The insulation layer 20 may electrically separate underlying conductive structures and upper conductive structures and may include oxide or nitride in accordance with manufacturing conditions and product characteristics of the semiconductor device. In the present example embodiment, the insulation layer 20 may include a lower insulation layer 1 on the substrate 10, an etch stop layer 2 on the lower insulation layer 1 and an upper insulation layer 3 on the etch stop layer 2. However, the insulation layer 20 may also include a single layer without the etch stop layer, as would be known to one of the ordinary skill in the art.

The hard mask layer 30 may include a single layer or a multilayer having at least two component layers having different etching characteristics. For example, the hard mask layer 30 may include a silicon nitride layer.

Figure 1B:
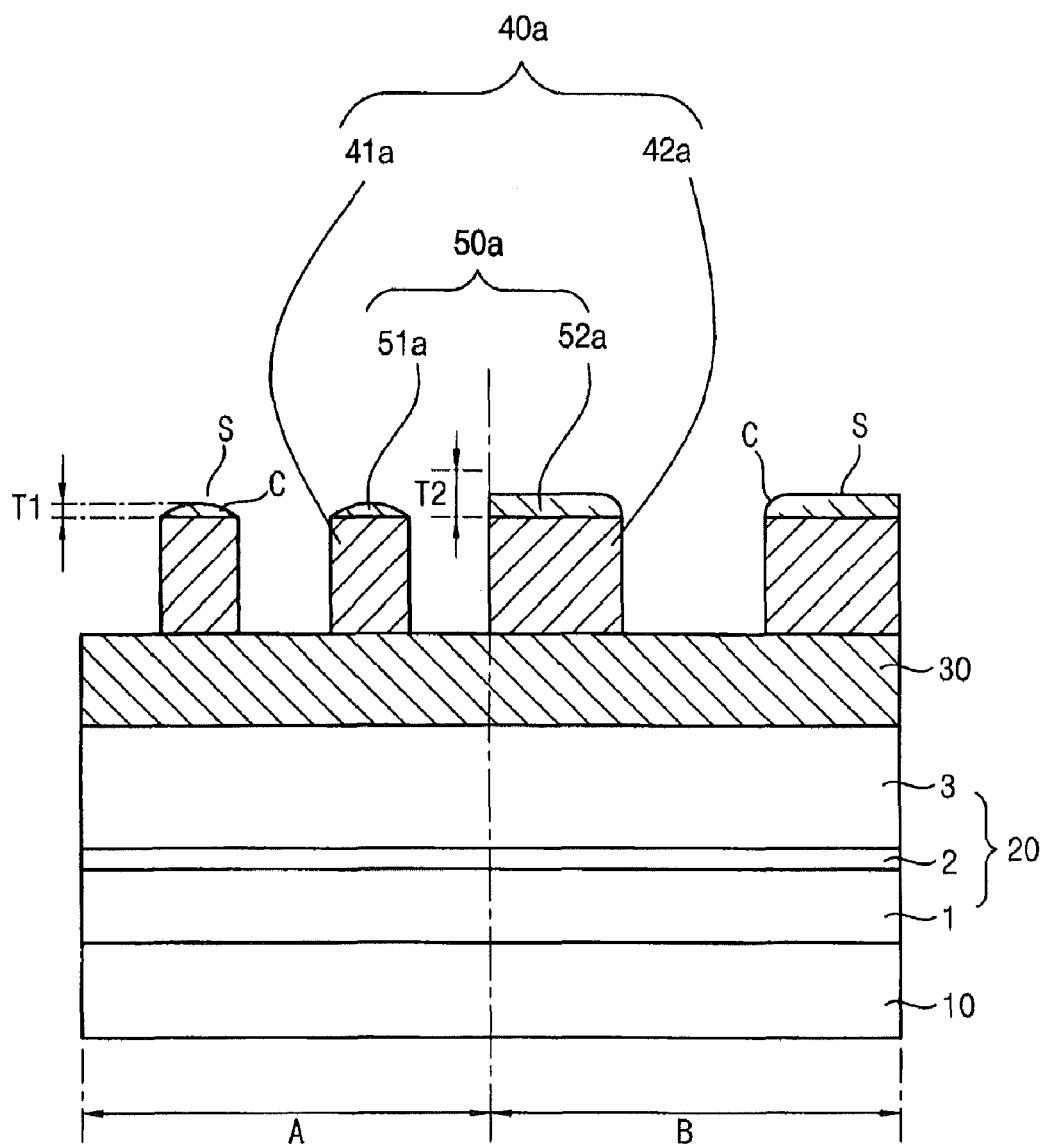

The sacrificial layer 40 may be formed on the hard mask layer 30 by a spin coating process or a chemical vapor deposition (CVD) process and may be into a first sacrificial pattern, referenced by numeral 41a in FIG. 1B, in the first area A and a second sacrificial pattern, referenced by numeral 42a in FIG. 1B, in the second area B of the substrate 10 in a subsequent process. The first sacrificial pattern may be used as an etching mask for patterning the first pattern having a relatively smaller line width and high density in the first area A and the second sacrificial pattern may be used as an etching mask for patterning the second pattern having a relatively larger line width and low density in the second area B of the substrate 10. Thus, the sacrificial layer 40 may include various materials in view of the underlying hard mask layer 30. For example, the sacrificial layer 40 may include an amorphous carbon layer (ACL) and a silicon-based layer comprising silicon-based material such as silicon oxide, silicon nitride, silicon carbon nitride and polysilicon.

The dummy mask layer 50 may be formed on the sacrificial layer 40 and may comprise a material having etching selectivity with respect to the underlying sacrificial layer 40. Thus, the dummy mask layer 50 may be formed into an etching mask for an etching process for forming the sacrificial pattern. For example, the dummy mask layer 50 may include a silicon-based material layer and may comprise any one of silicon oxynitride (SiON), silicon oxide, silicon nitride, silicon carbon nitride, polysilicon and combinations thereof. In contrast, the dummy mask layer 50 may include a metal layer and an organic material layer in other embodiments. Further, the dummy mask layer 50 may include a multilayer having an anti-reflection pattern for minimizing optical scattering.

In a subsequent three dimensional etching process, the dummy mask layer 50 may be formed into a first dummy pattern, referenced by numeral 51a in FIG. 1B, in the first area A and a second dummy pattern, referenced by numeral 52a in FIG. 1B, in the second area B of the substrate 10. The first and the second dummy patterns may have different line width and height.

In the present example embodiment, the dummy mask layer 50 may have a uniform thickness irrespective of the first and the second areas A and B of the substrate 10. In contrast, in other embodiments, the dummy mask layer 50 may have a non-uniform thickness in accordance with the first and the second areas A and B of the substrate 10. For example, the dummy mask layer 50 may have a smaller thickness in the first area A than in the second area B of the substrate 10. The dummy mask layer 50 may have a thickness sufficient for the subsequent three-dimensional etching process.

The mask pattern 60a may be formed on the dummy mask layer 50 and include a first mask pattern 61a arranged in the first area A and a second mask pattern 62a arranged in the second area B of the substrate 10. The mask pattern may function as an etching mask for an etching process against the dummy mask layer 50 and the sacrificial layer 40 in the first and the second areas A and B of the substrate 10, respectively. The first mask pattern 61a may have a relatively smaller line width and the second mask pattern 62a may have a relatively larger line width.

The line width of the first mask pattern 61a may be determined by a minimal feature size of a manufacturing target device such as a semiconductor device and the line width of the second mask pattern 62a may be determined to be larger than that of the first mask pattern 61a. In the present example embodiment, the first mask pattern 61a may have line widths ranging from a few nm to a few tens of nm.

Referring to FIG. 1B, a sacrificial pattern 40a and a dummy mask pattern 50a may be formed on the hard mask layer 30 and thus the hard mask layer 30 may be partially exposed through the sacrificial pattern 40a and the dummy mask pattern 50a.

In an example embodiment, the dummy mask layer 50 may be patterned into the dummy mask pattern 50a by an etching process using the mask pattern 60a as an etching mask. Thus, the mask pattern 60a may be transcribed into the dummy mask pattern 50a and the sacrificial layer 40 may be partially exposed through the dummy mask pattern 50a. Then, the sacrificial layer 40 may be patterned to the sacrificial pattern 40a by an etching process using the dummy mask pattern 50a as an etching mask. The hard mask layer 30 may be partially exposed through the sacrificial pattern 40a.

Since the dummy mask pattern 50a may include the first dummy mask pattern 51a arranged in the first area A and the second dummy mask pattern 52a arranged in the second area B, the sacrificial pattern 40a may also include the first sacrificial pattern 41a underlying the first dummy mask pattern 51a in the first area A and the second sacrificial pattern 42a underlying the second dummy mask pattern 52a in the second area B.

Particularly, the sacrificial pattern 40a may be patterned to have substantially the same line width as the mask pattern 60a while the dummy mask pattern 50a may be patterned to have the line width smaller than that of the mask pattern 60a, since the dummy mask pattern 50a may experience an additional etching process for forming the sacrificial pattern 40a as well as the etching process for forming the dummy mask pattern 50a.

When the sacrificial layer 40 may experience the etching process using the dummy mask pattern 50a as an etching mask, an isotropic etching process may be performed on the dummy mask pattern 50a and thus both of corner portions C and upper surface S of the dummy mask pattern 50a may be etched off at the same rate. Therefore, the corner portions C of the dummy mask pattern 50a may be formed into a round shape. In such a case, since the second dummy mask pattern 52a may have a sufficiently large size, the etching process against the upper surface S may be distinguished from the etching process against the corner portions C of the second dummy mask pattern 52a. However, since the first dummy mask pattern 51a may have such a small size that the etching process against the upper surface S may not be distinguished from the etching process against the corner portions C of the first dummy mask pattern 51a. Thus, etching resistance of the second dummy mask pattern 52a may be much greater than that of the first dummy mask pattern 51a in the same etching process. For the above reasons, the etching against the upper surface S and the etching against the corner portions C may be overlapped and have a mutual effect on each other at the first dummy mask pattern 51a. Thus, the etching process against the first dummy mask pattern 51a may be performed multiple directions (referred to as three-dimensional etching process in this application) and the upper portion of the first dummy mask pattern 51a may be etched off rapidly due to the intensification of the etching process. In contrast, the second dummy mask pattern 52a may be more resistive to the same etching process as against the first dummy mask pattern 51a, because the line width and the upper surface of the second dummy mask pattern 52a is relatively larger than that of the first dummy mask pattern 52a. Therefore, the upper portion of the first dummy mask pattern 51a may be etched off much more rapidly than that of the second dummy mask pattern 52a in the same etching process due to the three dimensional etching process. The difference of the etching rates of the first and the second dummy mask patterns 51a and 52a may be clearly increased as the difference of the line widths of the first and the second dummy mask patterns 51a and 52a.

That is, although the dummy mask layer 50 may be formed to a uniform thickness across the first and second areas of the substrate 10, the thickness T1 of the first dummy mask pattern 51a may become smaller than the thickness T2 of the second dummy mask pattern 52a when the first sacrificial pattern 41a may be formed in the first area A and the second sacrificial pattern 42a may be formed in the second area B of the substrate 10.

Figure 1C:
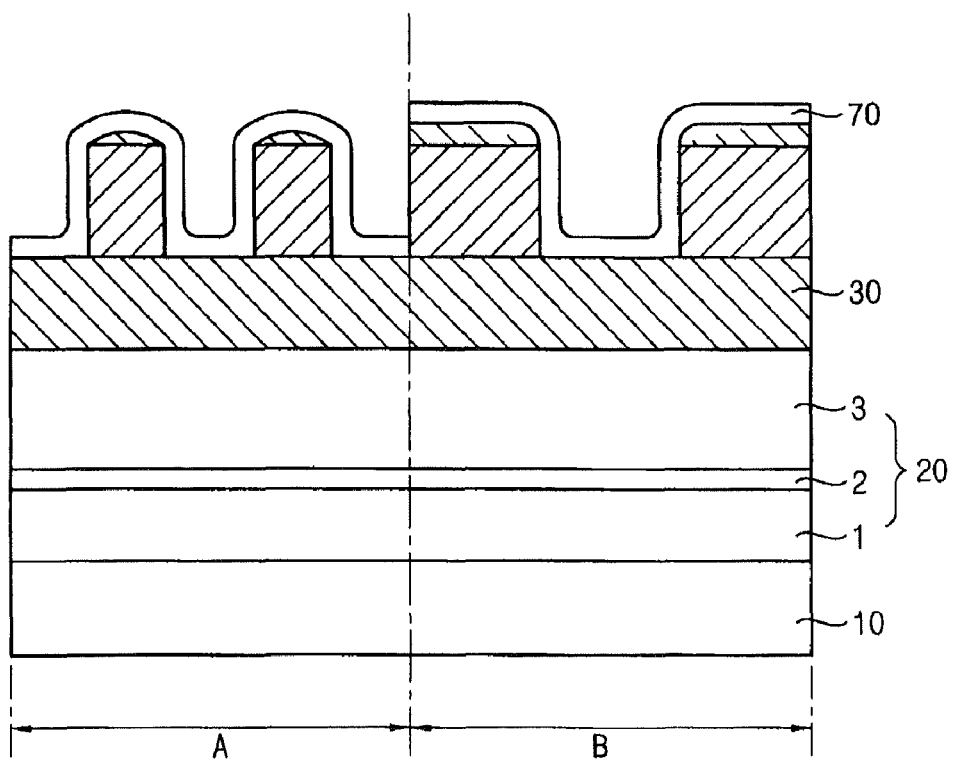

Referring to FIG. 1C, a spacer layer 70 may be formed on the substrate 10 including the dummy mask pattern 50a and the sacrificial pattern 40a along a surface profile thereof.

For example, the spacer layer 70 may be uniformly formed across the first and the second areas A and B of the substrate 10 by an atomic layer deposition (ALD) process. The spacer layer 70 may comprise a material having etching selectivity with respect to the dummy mask pattern 50a, the sacrificial pattern 40a and the hard mask layer 30 such as an oxide and a nitride.

Figure 1D:
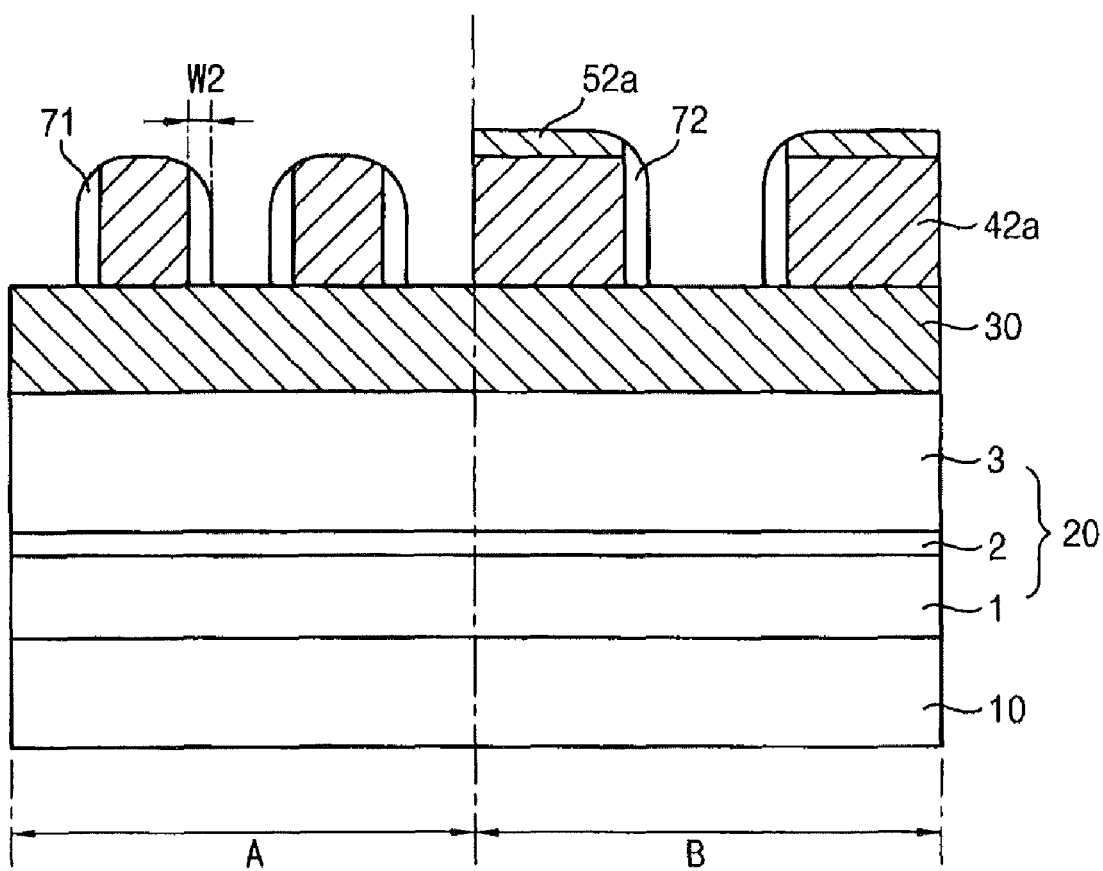

Referring to FIG. 1D, the spacer layer 70 may be partially removed from the substrate 10 by an anisotropic etching process to thereby form a first spacer 71 on a sidewall of the first sacrificial pattern 41a and a second spacer 72 on a sidewall of the second sacrificial pattern 42a. Thus, the hard mask layer 30 may still be partially exposed through the sacrificial pattern 40a on which the first and second spacers may be formed.

In the anisotropic etching process, the dummy mask pattern 50a on the sacrificial pattern 40a may also be etched off from the substrate 10. Particularly, the first dummy mask pattern 51a may be fully removed from the first sacrificial pattern 41a by the three dimensional etching process and thus the upper surface of the first sacrificial pattern 41a may be exposed. In contrast, the second dummy mask pattern 52a may be partially removed from the second sacrificial pattern 42a and thus the upper surface of the second sacrificial pattern 42a may be still covered with the second dummy mask pattern 52a. That is, the first dummy mask pattern 51a may be fully removed from the first area A of the substrate 10 and the second dummy pattern 52a may remain on the second sacrificial pattern 42a in the second area B of the substrate 10.

Otherwise, the process conditions of the anisotropic etching process may be intentionally controlled in such a manner that the second dummy mask pattern 52a may remain on the second sacrificial pattern 42a.

While the present example embodiment discloses that the spacer layer 70 and the dummy mask pattern 50a may be removed in-situ with each other by the same anisotropic etching process, the spacer layer 70 and the dummy mask pattern 50a may be individually removed from the substrate 10 by a respective etching process.

Figure 1E:
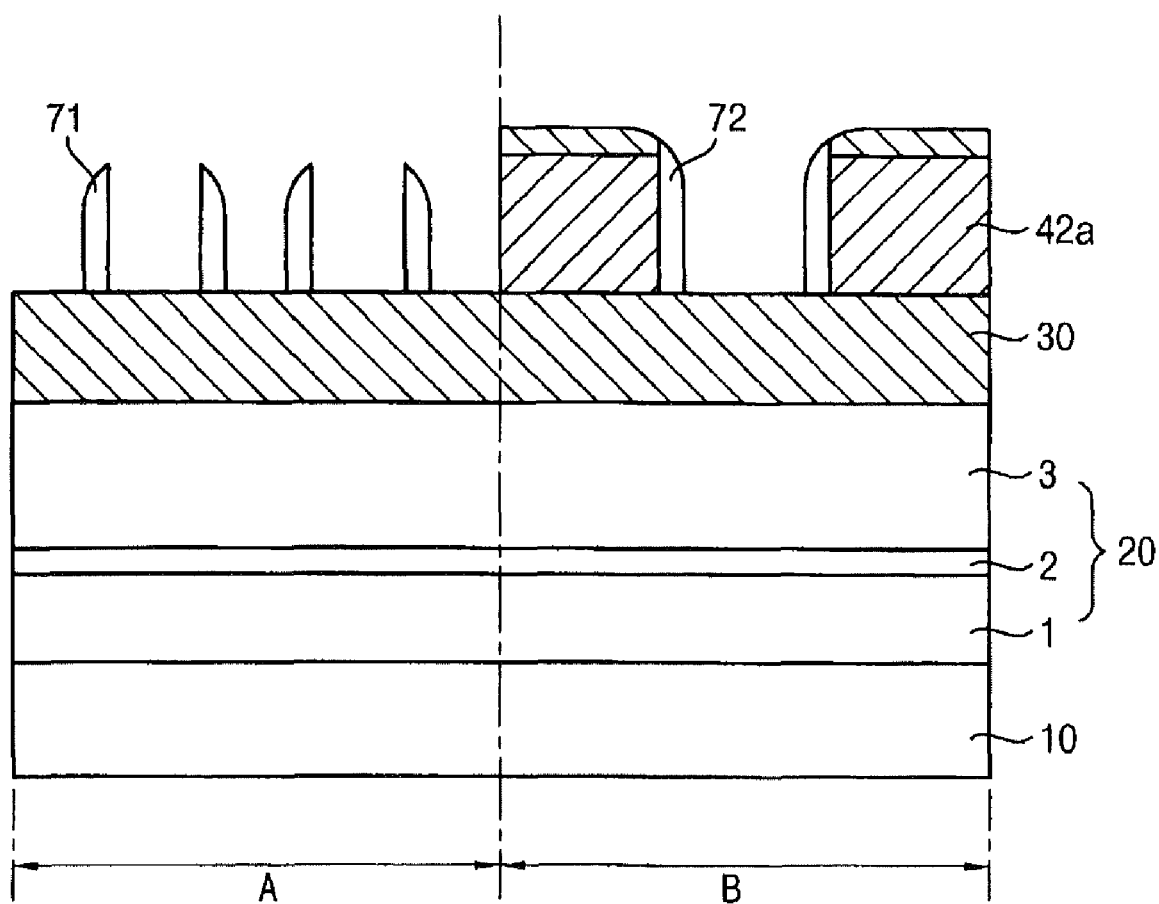

Referring to FIG. 1E, the first sacrificial pattern 41a may be removed from the first area A of the substrate 10. The second dummy mask pattern 52a and the second spacer 72 may make contact with each other and thus the second sacrificial pattern 42a may be sufficiently covered with the second dummy mask pattern 52a and the second spacer 72. Therefore, the first sacrificial pattern 41a may be removed from the first area A of the substrate 10 by a removal process and the second sacrificial pattern 42a may be protected from the same removal process by the second dummy mask pattern 52a and the second spacer 72. That is, the first sacrificial pattern 41a is removed from the substrate while the second sacrificial pattern 42a may still remain in the second area B of the substrate 10.

As a result, the first spacer 71a may merely remain on the hard mask layer 30 in the first area A of the substrate 10 while the second sacrificial pattern 42a, the second dummy mask pattern 52a and the second spacer 72 may remain on the hard mask layer 30 in the second area B of the substrate 10.

For example, the removal process for removing the first sacrificial pattern 41a may include a strip process, an ashing process and an etching process. A dry etching process or a wet etching may be used for removing the first sacrificial pattern 41a.

Figure 1F:
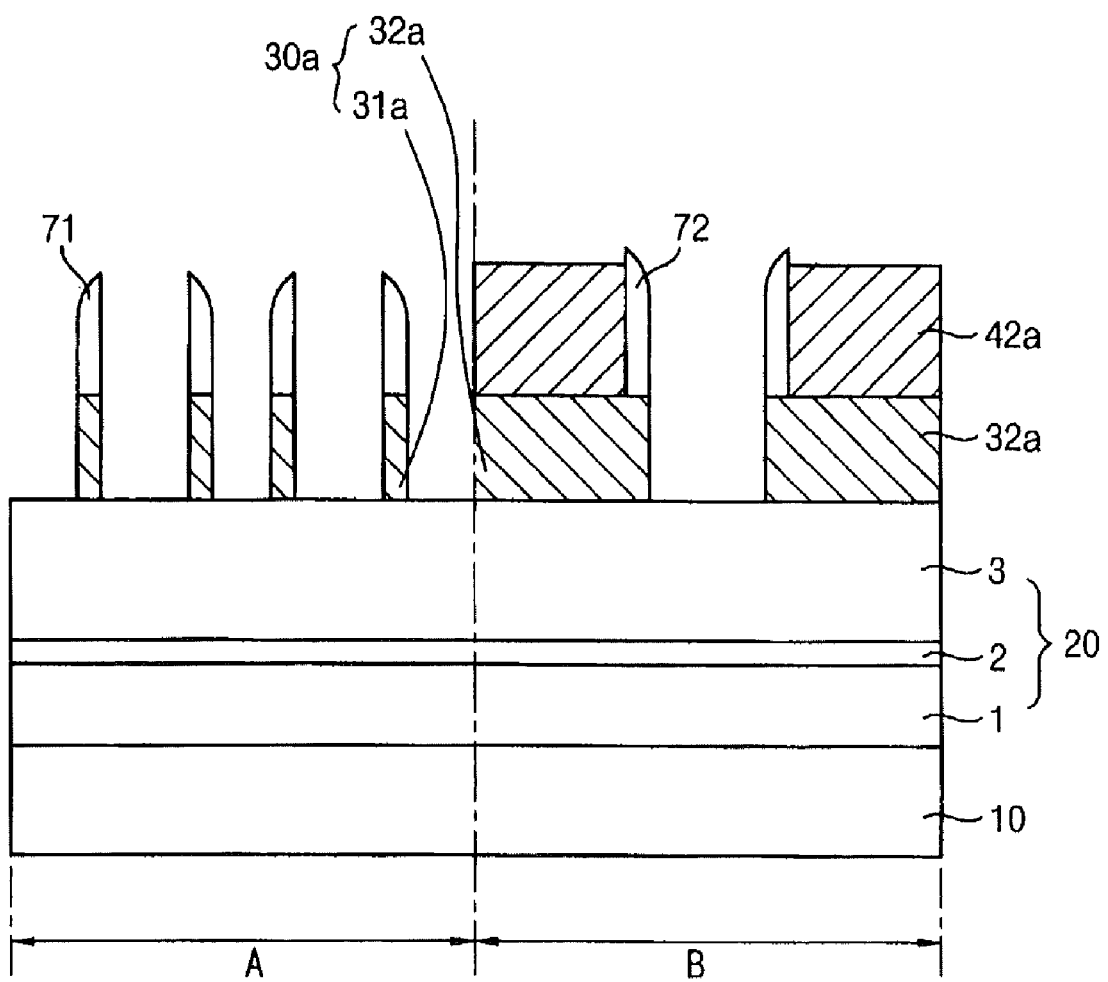

Referring to FIG. 1F, a hard mask pattern 30a may be formed on the insulation layer 20. The hard mask pattern 30a may include a first hard mask pattern 31a in the first area A of the substrate 10 and a second hard mask pattern 32a in the second area B of the substrate 10.

The hard mask layer 30 in the first area A may be removed from the insulation layer 20 by an etching process using the first spacer 71 as an etching mask and the hard mask layer 30 in the second area B may be removed from the insulation layer 20 by an etching process using the second spacer 72 as an etching mask. Thus, the first hard mask pattern 31a may have a line width that is relatively smaller than that of the second hard mask pattern 32a and the second hard mask pattern 32a may have a line width that is relatively larger than that of the first hard mask pattern 31a. The second dummy mask pattern 52a may be removed from the second sacrificial pattern 42a in the etching process for forming the second hard mask pattern 32a in the second area B of the substrate 10.

Therefore, the first hard mask pattern 31a having a relatively small line width may be formed on the insulation layer 20 in the first area A of the substrate 10 by the three dimensional etching process using the first spacer 71 as an etching mask, while the second hard mask pattern 32a having a relatively large line width may be formed on the insulation layer 20 in the second area B of the substrate 10 by a normal etching process using the second spacer 72. In such a case, the three dimensional etching process and the normal etching process may be simultaneously performed just merely in the same photolithography process although the first and the second hard mask patterns 31a and 32a may have different line widths.

Figure 1G:
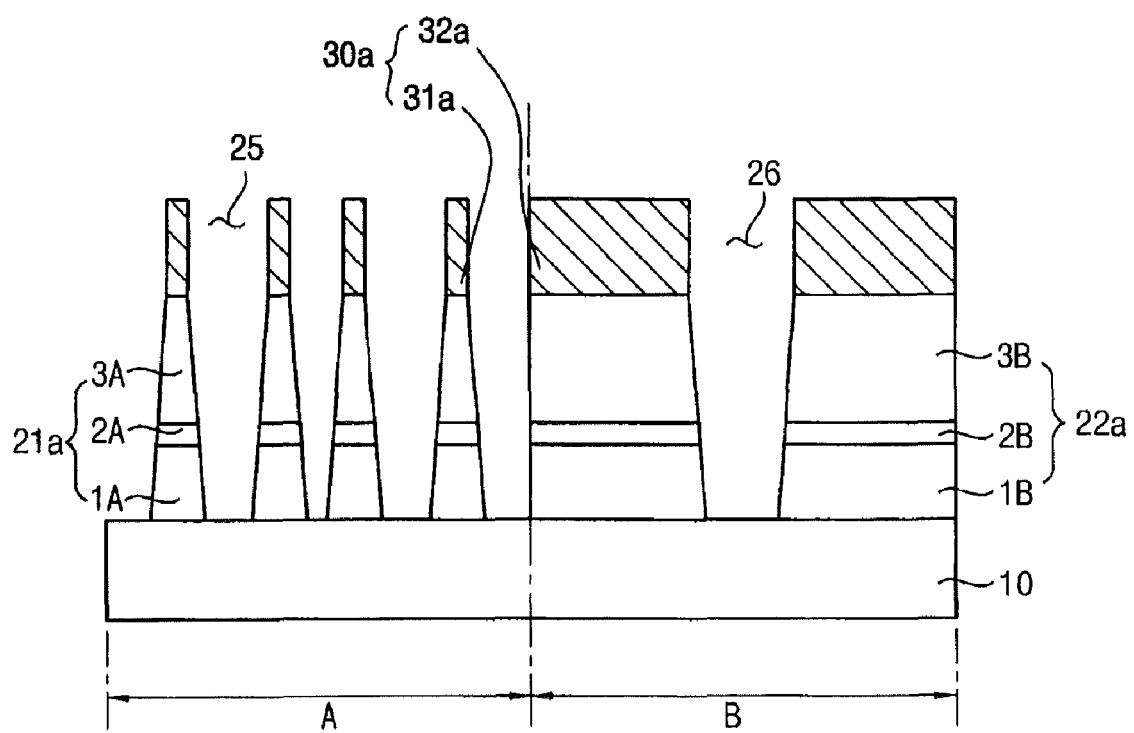

Referring to FIG. 1G, the insulation layer 20 may be patterned into an insulation pattern 20a by a damascene process using the hard mask pattern 30a as an etching mask.

The insulation layer 20 in the first area A of the substrate 10 may be patterned into a first insulation pattern 21a by a damascene process using the first hard mask pattern 31a as an etching mask, thereby forming a first trench 25 through which the substrate 10 in the first area A may be partially exposed. Further, the insulation layer 20 in the second area B of the substrate 10 may be patterned into a second insulation pattern 22a by a damascene process using the second hard mask pattern 32a as an etching mask, thereby forming a second trench 26 through which the substrate 10 in the second area B may be partially exposed.

In the present example embodiment, the first insulation pattern 21a may include a cell lower insulation pattern 1A, a cell etch stop pattern 2A and a cell upper insulation pattern 3A, and the second insulation pattern 22a may include a peripheral/core lower insulation pattern 1B, a peripheral/core etch stop pattern 2B and a peripheral/core upper insulation pattern 3B.

Therefore, the insulation pattern 20a may also be formed into a double damascene pattern in which the first and the second trenches 25 and 26 may have different widths at upper and lower portions thereof, respectively.

Thus, various conductive structures on the substrate 10 may be exposed through the first and the second trenches 25 and 26 in the insulation pattern 20a. For example, a common source line (CSL) and cell drain regions of a flash memory device and a gate electrode and source/drain regions of the gate electrode for a transistor in a peripheral circuit may be simultaneously exposed through the first and the second trenches 25 and 26.

The present embodiment exemplarily discloses the cell and the peripheral/core areas as the first and the second areas, respectively, in which two kinds of the wiring structures having different pattern sizes are positioned at each areas and contrasted with each other. However, any other pairs of areas of the substrate may also be used as the first and the second areas as long as the pattern sizes of each area are contrasted with each other, as would be known to one of the ordinary skill in the art. For example, a wiring separation pattern may be positioned in the cell area of a flash memory device so as to effectively separate various wiring structures from one another, and the width of the wiring separation pattern may be quite larger than that of a bit line of the flash memory device. In such a case, the bit line area of the substrate in which a plurality of the bit lines having a relatively larger width is arranged may be used as the first area A and the separation pattern area of the substrate in which the wiring separation pattern having a relatively smaller width is arranged may be used as the second area B.

Figure 1H:
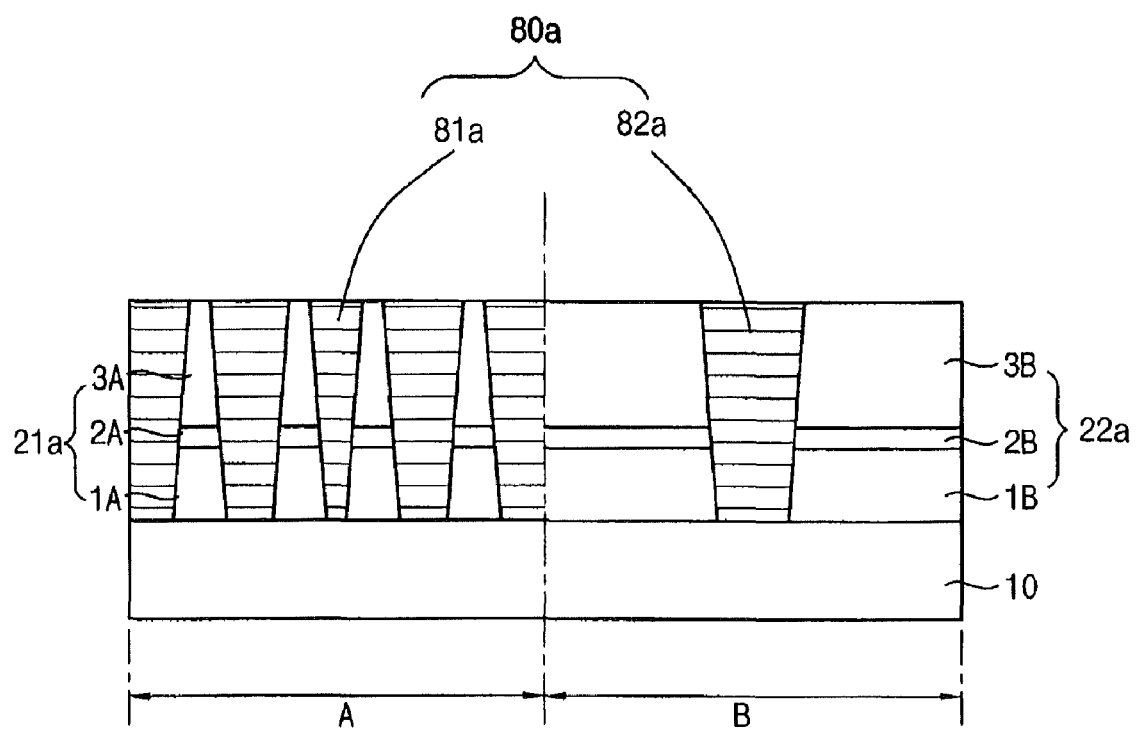

Referring to FIG. 1H, the first and the second trenches 25 and 26 may be filled with conductive materials, to thereby form the wiring structures 80a of the semiconductor device.

In an example embodiment, the conductive materials may be deposited onto the substrate 10 including the first and the second trenches 25 and 26 to a sufficient thickness to fill up the first and second trenches 25 and 26, thereby forming a conductive layer (not shown) on the hard mask pattern 30a filling up the first and second trenches 25 and 26. Then, the conductive layer and the hard mask pattern 30a may be removed from the insulation pattern 20a by a planarization process, and thus the conductive layer may remain merely in the first and the second trenches 25 and 26 to thereby form a conductive pattern 80a on the substrate 10. The conductive pattern 80a may function as the wiring structures of the semiconductor device.

For example, a first conductive pattern 81a in the first trench 25 at the first area A, which may be referred to as first wiring structure, may include a bit line electrically connected to a CSL of a flash memory device and a cell metal wring applying various signals to each transistor in a cell area of the semiconductor device. In addition, a second conductive pattern 82a in the second trench 26 at the second area B, which may be referred to as second wiring structure, may include a peripheral circuit wiring arranged in the peripheral/core area of the flash memory device and applying driving signals to peripheral circuits for driving transistors in the cell areas of the flash memory device.

In such a case, the first conductive pattern 81a may be arranged at the first area of the substrate 10 in such a manner that the line width of each line of the first conductive pattern 81a may be substantially the same as that of the first mask pattern 61a and the neighboring lines of the first conductive pattern 81a may be spaced apart from each other by a gap distance corresponding to the width of the first spacer 71. Thus, the distribution density of the first wiring structure in the first area A may be controlled by the width of the first spacer 71 and the pitch of the first mask pattern 61a.

Figure 2:
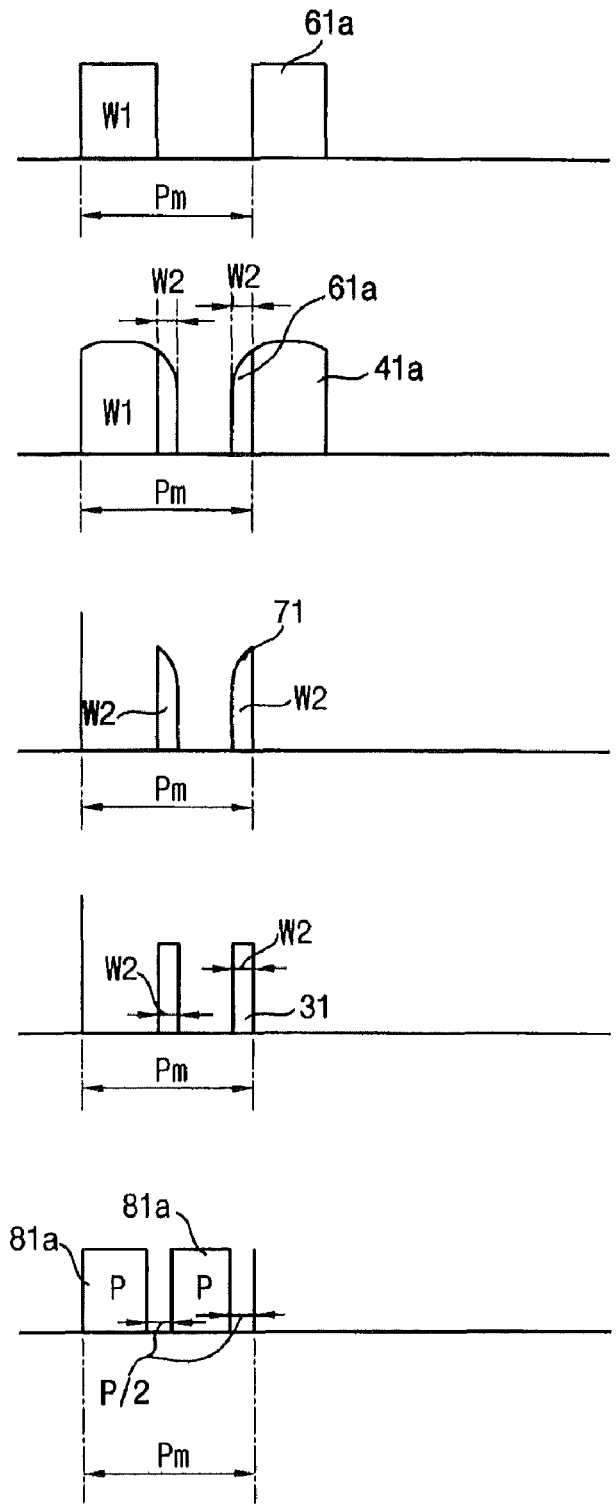
FIG. 2 illustrates the distribution density of the first wiring structure according to the width of the first spacer in the first area of the substrate.

FIG. 2 is a view illustrating the distribution density of the first wiring structure according to the width of the first spacer in the first area of the substrate.

Referring to FIG. 2, when the first mask pattern 61a may have a mask width W1 and a mask pitch Pm in the first area A, the gap distance between neighboring lines of the first sacrificial pattern 41a may be set to be Pm-W1. A pair of the first spacers 71 may be positioned between the neighboring lines of the first sacrificial pattern 41a and thus the spacer width W2 of the first spacer 71 may be set to be (Pm-W1)/2. Therefore, the gap distance between the neighboring first wiring structures 81a may be controlled by variation of the spacer width W2 of the first spacer 71 thereby controlling the distribution density of the first wiring structure in the pitch of the first mask pattern 61a.

For example, when the mask pitch Pm of the first mask pattern 61a is set to be about three times a pitch P of the first wiring structure and the spacer width W2 of the first spacer 71 is set to be about 0.5 times the pitch P of the first wiring structure, a pair of the first wiring structures are arranged in the mask pitch Pm of the first mask pattern 61a with being spaced apart by a gap distance P/2. Therefore, the distribution density of the first wiring structure may be doubled in the first area A of the substrate 10.

According to the present example embodiment of forming the wiring structure for a semiconductor device, at least two kinds of patterns having different line width may be formed in the first and the second areas of the substrate, respectively, by a consecutive photolithography process using a single mask pattern, thereby remarkably improving a process efficiency for manufacturing the semiconductor device. In addition, the distribution density of the wiring structure in the semiconductor device may be easily controlled by variation of the width of the spacer pattern.

Non-volatile Memory Device and Method of Manufacturing the Same

Figure 3:
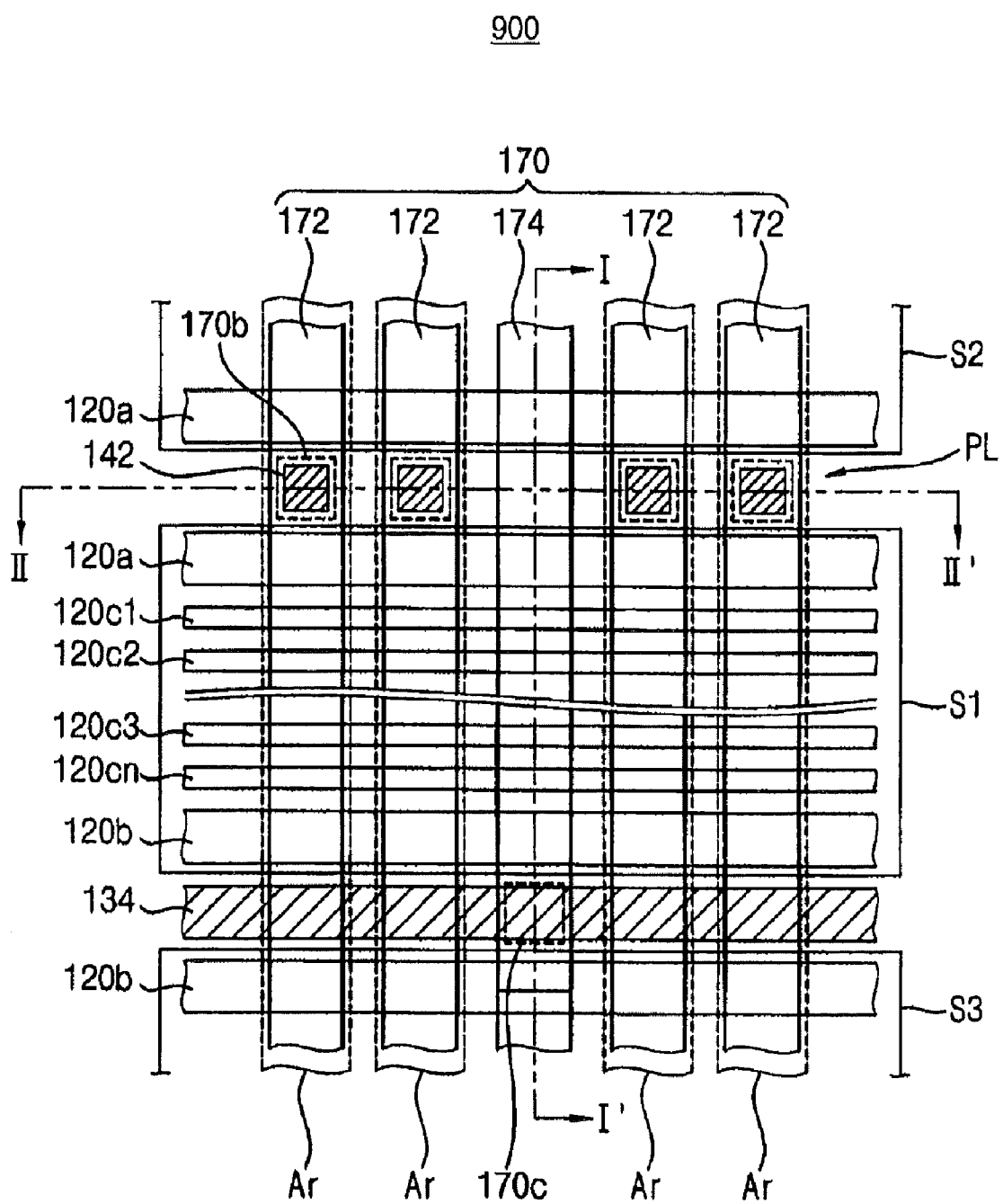
FIG. 3 is a plan view illustrating a flash memory device in accordance with some embodiments of the present inventive concept.
Figure 4A:
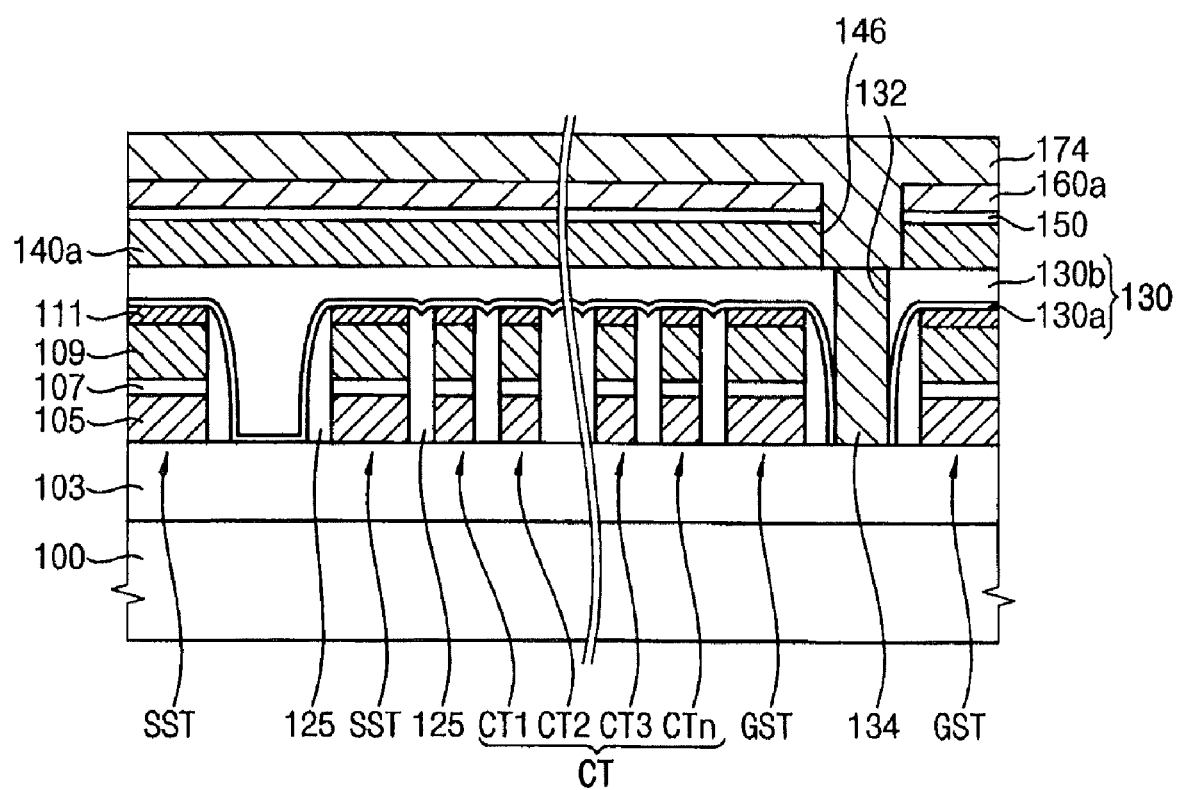
FIGS. 4A and 4B are cross-sectional views taken along line I-I' and line II-II' of the flash memory device illustrated in FIG. 3, respectively.
Figure 4B:
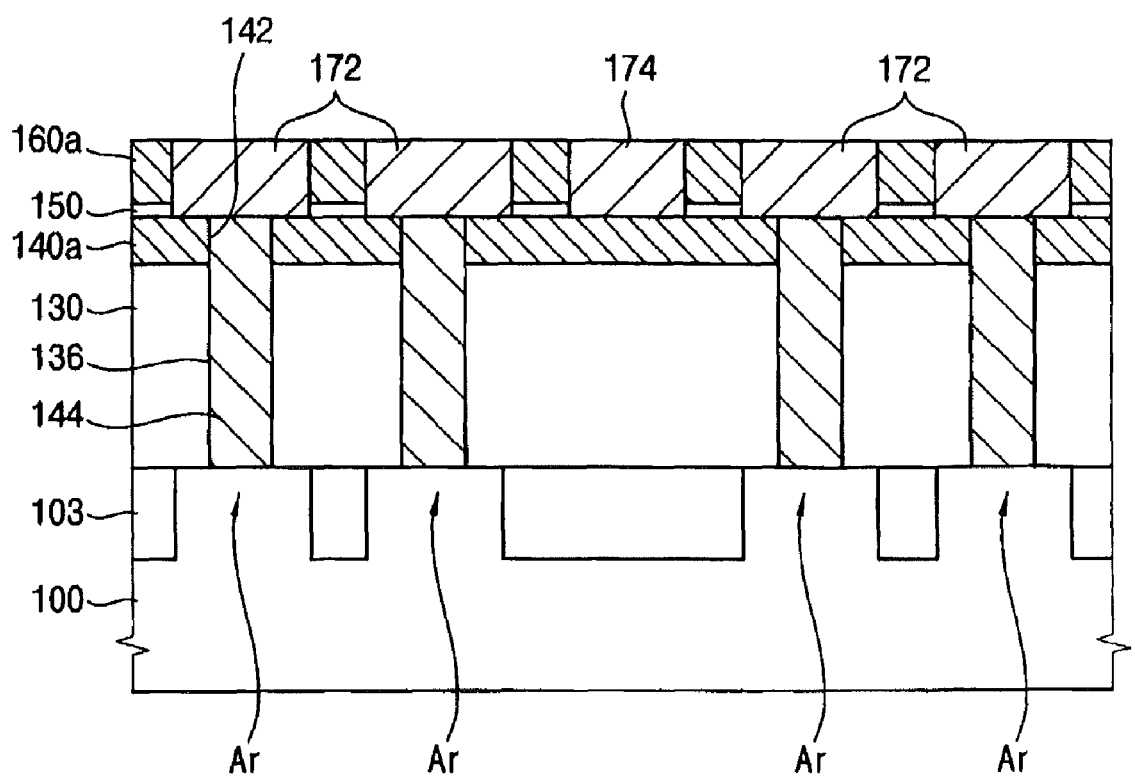

FIG. 3 is a plan view illustrating a flash memory device in accordance with an example embodiment of the present inventive concept. FIGS. 4A and 4B are cross-sectional views cut along a line I-I' and a line II-II' of the flash memory device illustrated in FIG. 3, respectively.

Referring to FIGS. 3, 4A and 4B, a flash memory device 900 may include a semiconductor substrate 100 that may be divided into an active region Ar and a field region by an insulation layer 103. The active region Ar may be defined by the insulation layer 103 and various conductive structures may be formed in the active region of the substrate 100. Thus, the conductive structures in the neighboring active regions Ar may be electrically isolated from each other by the insulation layer 103 and may function just like independent electronic devices irrespective of the neighboring active regions Ar.

For those reasons, the insulation layer 103 may be sometimes called as a device isolation layer. In the present example embodiment, the active regions Ar may be defined to be a plurality of lines extending along a first direction on the substrate 100.

First, second and third gate patterns 120a, 120b and 120c may extend along a second direction substantially perpendicular to the first direction on the substrate 100. Thus, the first, second and third gate patterns 120a, 120b and 120c may extend across the active region Ar and the field region of the substrate 100. In the present example embodiment, the first gate pattern 120a may include a single conductive line functioning as a string selection line (SSL) of the flash memory device and the second gate pattern 120b may include a single conductive line functioning as a ground selection line (GSL) of the flash memory device. The third gate pattern 120c may include a plurality of conductive lines interposed between the SSL and the GSL and may function as word lines WL of the flash memory device.

A string selection transistor (SST) may be arranged at a crossing point of the first gate pattern 120a and the active region Ar of the substrate 100 and a ground selection transistor (GST) may be arranged at a crossing point of the second gate pattern 120b and the active region Ar of the substrate 100. A plurality of cell transistors (CT) may be positioned at each crossing point of the third gate pattern 120c and the active region Ar of the substrate 100. Each of the SST, GST and the CTs may include a gate oxide layer (not shown), a floating gate 105, a gate dielectric layer 107 and a control gate 109.

A capping layer 111 may be further positioned on each of the gate patterns 120a, 120b and 120c and a spacer 125 may be positioned on sidewalls of the gate patterns 120a, 120b and 120c. The capping layer 111 may include a silicon nitride layer and the spacer 125 may include any one of a silicon nitride layer, silicon oxide layer and a stacked multilayer thereof.

Source and drain regions (not shown) may be arranged at both side portions of each transistor of the SST, GST and CTs that are arranged on the active regions Ar of the first, second and third gate patterns 120a, 120b and 120c, respectively, along the first direction. A plurality of the memory cell arrays may be arranged at the crossing points of the active regions extending in the first direction and the word lines extending in the second direction. The SSL and the GSL may be arranged at the active region Ar off from a $1^{st}$ word line $120c_1$ and an $n^{th}$ word line $120c_n$. Thus, the SSL, the GSL and the WLs interposed between the SSL and the GSL may function as a unit memory block of the flash memory device, which may be called as "string" sometimes. In the string of the flash memory device, a plurality of the cell transistors, which may be arranged on the active region Ar of the third gate pattern 120c arranged in the first direction, may extend in series and share the source/drain regions.

An insulation layer 130 may be provided with the flash memory device and thus the first to third gate patterns 120a, 120b and 120c may be electrically insulated from one another and from metal wirings over the gate patterns 120a to 120c.

For example, the insulation layer 130 may include a protection layer 130a and a flat layer 130b. The protection layer 130a may be formed on the substrate 100 including the first to third gate patterns 120a to 120c along a surface profile thereof and thus a gap space may be provided between the neighboring gate patterns 120a to 120c. Therefore, the protection layer 130a may include a material having good gap-fill characteristics. The gate patterns 120a to 120c may be protected from a subsequent etching process by the protection layer 130a. The gap space between the neighboring gate patterns may be filled up with the flat layer 130b of which an upper portion may be planarized.

The insulation layer 130 may include a first contact hole 132 and a second contact hole 136. Each active region Ar and the device isolation layer 103 interposed between the neighboring GSLs may be exposed through the first contact hole 132 and each active region Ar interposed between the neighboring SSTs may be exposed through the second contact hole 136. The first contact hole 132 may be filled up with conductive materials such as polysilicon, and thus the common source line CSL 134 may extend along the GSL. Therefore, the active region Ar and the device isolation layer 130 exposed through the first contact hole 132 may make common contact with the GSL. An upper surface of the CSL and an upper surface of the insulation layer 130 may be coplanar with each other.

A first insulation interlayer pattern 140a having first and second via holes 142 and 146 may be positioned on the insulation layer 130 and the CSL 134 and thus the contact plugs 144 may be electrically insulated from one another by the first insulation interlayer pattern 140a. The first via hole 142 may expose and open into the second contact hole 136 and the CSL may be exposed through the second via hole 146. Conductive materials may be filled into the second contact hole 136 and the first via hole 142, and the contact plug 144 may be positioned in the second contact hole 136 and the first via hole 142. Thus, the contact plug 144 may make contact with each active region between the SSTs. A low-resistive metal may be filled into the second via hole 146, and a cell metal wiring 174 may be positioned in the second via hole 146. The cell metal wiring 174 may make contact with the CSL 134 between the GSLs.

For example, the contact plug 144 may include a polysilicon layer, a metal layer comprising tungsten (W) and aluminum (Al) and a multi-layer having the polysilicon layer and the metal layer. An upper surface of the contact plug 144 may be coplanar with an upper surface of the first insulation interlayer pattern 140a.

Since the contact plug 144 may be positioned adjacent to the SST at each of the active regions extending along the first direction, a number of the contact plugs 144 may be aligned in series along the second direction and thus a contact plug line PL may be positioned in parallel with the SSL. A first string S1 including the SSL 120a, the GSL 120b and the word lines 120c interposed between the SSL 120a and GSL 120b may be arranged symmetrical to a second string S2 including another SSL, GSL and WLs (not shown) with respect to the PL. Thus, the first and the second strings S1 and S2 may be a mirror image to each other with respect to the PL. That is, a single contact plug 144 may be formed between the neighboring SST in each of the active regions Ar and a pair of the SSTs adjacent to each other in the same active region may be connected to a same or common single contact plug 144.

The CSL may be positioned in parallel with the GSL. Particularly, a third string may be arranged symmetrically to the first string S1 with respect to the CSL 134, and thus the first and the third strings S1 and S3 may be an mirror image to each other with respect to the CSL 134. The GSTs on the GSL may be connected to a same or common CSL.

Thus, the contact plug 144 may be commonly connected to the drain electrodes of the SSTs of the first and second strings S1 and S2 and the CSL may be commonly connected to the source electrodes of the GSTs of the first and third strings S1 and S3.

An etch stop layer 150 may be positioned on the contact plug 144 and the first insulation interlayer pattern 140a and a second insulation interlayer pattern 160a may be positioned on the etch stop layer 150. The etch stop layer 150 may terminate an etching process for forming the second insulation interlayer pattern 160a, for example, a damascene pattern.

The second insulation interlayer pattern 160a may include a first trench 162 through which the etch stop layer 150 on the contact plug 144 may be exposed and a second trench 164 through which the etch stop layer 150 over the device isolation layer 103 may be exposed.

A first conductive metal may be filled into the first trench 162 to thereby form a bit line 172 making contact with the contact plug 144 and a second conductive metal may be filled into the second trench 164 to thereby form a cell metal wiring 174 making contact with the CSL. The first conductive metal may be substantially the same as the second conductive metal and the bit line 172 may be formed simultaneously with the cell metal wiring 174 in a single process.

The bit line 172 may have a width larger than that of the first via hole 142 and may extend along the first direction over the active region Ar and the cell metal wiring 174 may have a width larger than that of the second via hole 146 and may extend along the first direction over the device isolation layer 103. Thus, the bit line 172 may make contact with the contact plug 144 exposed through the first via hole 142 in the active region Ar of the substrate 100 and other conductive structures in the same active region Ar may be electrically insulated from the bit line 172 by the first insulation layer 130. In addition, the cell metal wiring 174 may make contact with the CSL 134 exposed through the second via hole 146 and penetrating through the first insulation layer 130.

Particularly, the cell metal wiring 174 and the bit line 172 may be positioned on the second insulation interlayer pattern 160a in the cell area of the substrate 100 by a double patterning process using a single photo mask, thereby increasing the density of the metal wiring 174 and the bit line 172 in the cell area. Thus, although the critical dimension (CD) of the semiconductor device may be decreased to degree less than about 40 nm, the bit line 172 and the cell metal wiring 174 may be sufficiently arranged on the second insulation interlayer pattern 160a.

According to the flash memory device of the present example embodiment, the bit line and the cell metal wiring of which the widths may be different may be arranged in the cell area of the substrate at high distribution density by a double patterning process. Particularly, the distribution density of the bit line and the metal wiring may be easily controlled by variation of the width of the spacer pattern although the CD of the flash memory device may be decreased less than about 40 nm.

Hereinafter, a method of manufacturing the flash memory device illustrated in FIGS. 3, 4A and 4B will be described in detail with reference to FIGS. 5A to 9B.

FIGS. 5A to 9B are cross sectional view illustrating processing steps for a method of manufacturing a non-volatile memory device shown in FIG. 3. The following disclosed process steps are merely illustrative and exemplarily embodiments for manufacturing the flash memory device shown in FIGS. 3, 4A and 4B and thus are not to be construed as limiting thereof. In addition, while the present example embodiment may disclose the flash memory device as an example embodiment of semiconductor device in which the wiring structure illustrated in FIG. 1H may be used as a bit line, any other semiconductor devices as well as the flash memory device, for example, a dynamic random access memory (DRAM) device, may also use the wiring structure illustrated in FIG. 1H as a bit line thereof, as would be known to one of the ordinary skill in the art.

Particularly, FIGS. 5A, 6A, 7A, 8A and 9A are cross-sectional views cut along a line I-I' in FIG. 3 and FIGS. 5B, 6B, 7B, 8B and 9B are cross-sectional views cut along a line II-II' in FIG. 3.

Figure 5A:
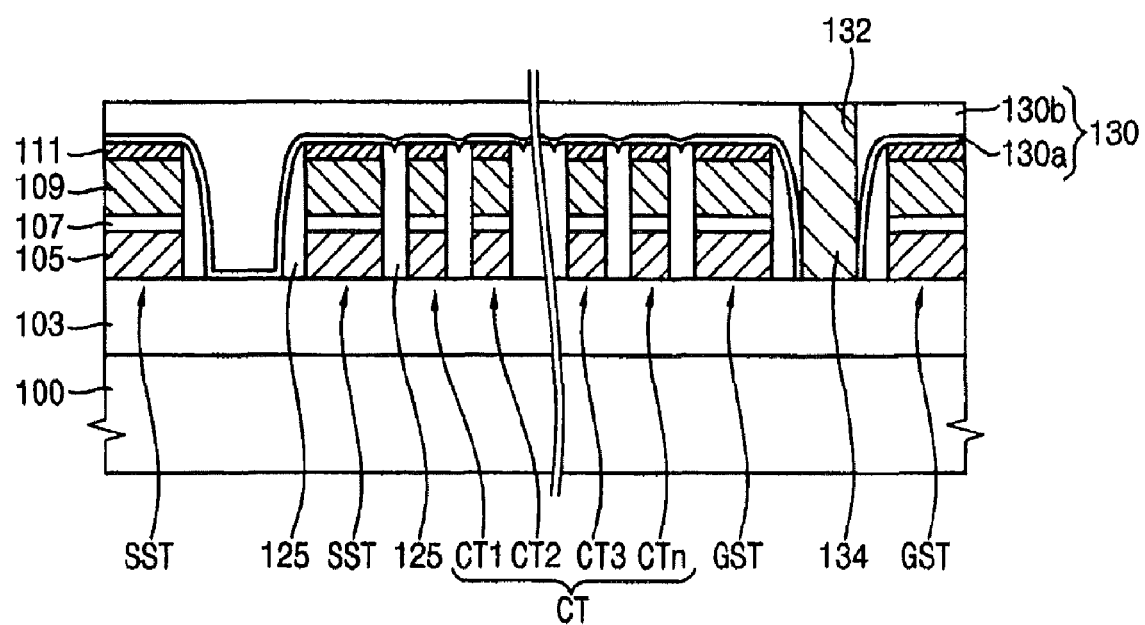
FIGS. 5A to 9B are cross sectional views illustrating fabrication steps for manufacturing a non-volatile memory device as shown in FIG. 3.
Figure 5B:
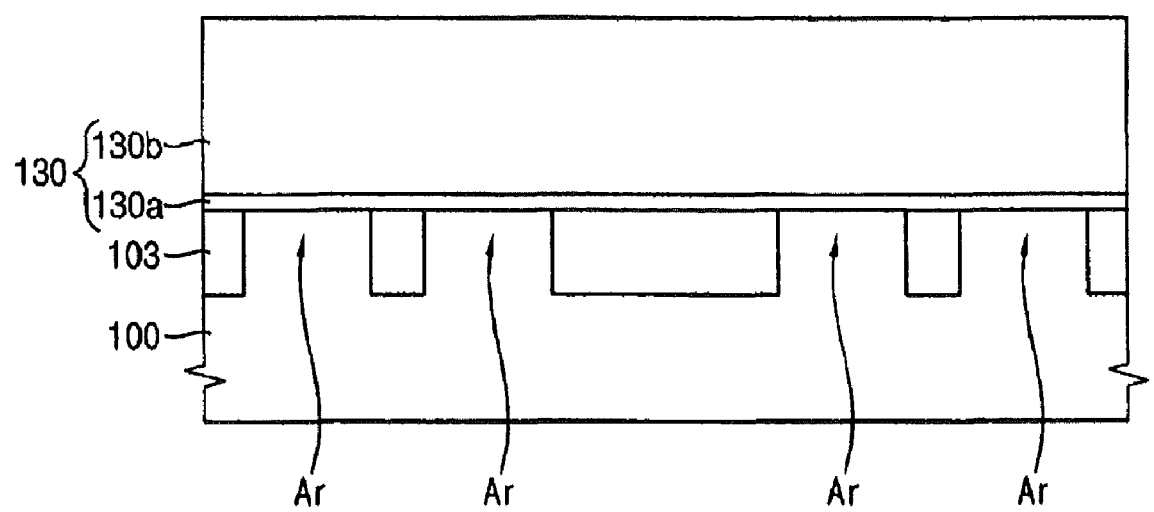

Referring to FIGS. 3, 5A and 5B, a substrate 100 having a cell array region may be prepared for manufacturing the flash memory device 900. A device isolation layer 103 may be formed on the substrate 100, thereby defining an active region Ar on which conductive structures may be formed. The active region Ar may be formed into a line shape extending in a first direction.

The conductive structures including first, second and third gate patterns 120a, 120b and 120c may be formed on the active region Ar of the substrate 100. Particularly, the first gate pattern 120a may function as a string selection line (SSL)

of the flash memory device 900 and the second gate pattern 120b may function as a ground selection line (GSL) of the flash memory device 900. A plurality of the third gate pattern 120c may be interposed between the first and the second gate patterns 120a and 120b and may function as word lines (WL) of the flash memory device 900.

A string selection transistor (SST) may be formed at a crossing point of the first gate pattern 120a and the active region Ar of the substrate 100 and a ground selection transistor (GST) may be formed at a crossing point of the second gate pattern 120b and the active region Ar of the substrate 100. A plurality of cell transistors (CT) may be formed at each crossing point of the third gate pattern 120c and the active region Ar of the substrate 100. Each of the SST, GST and the CTs may include a gate oxide layer (not shown), a floating gate 105, a gate dielectric layer 107 and a control gate 109.

A capping layer 111 may be formed on each of the gate patterns 120a, 120b and 120c. A spacer 125 may be further formed on sidewalls of the gate patterns 120a, 120b and 120c. A first ion implantation process may be performed onto the substrate 100 using the gate patterns as an ion implantation mask, thereby forming a lightly doped impurity region at surface portions of the substrate 100. Then, a second ion implantation process may be performed onto the substrate 100 using the gate patterns and the spacers as an ion implantation mask, thereby forming a heavily doped impurity region at surface portions of the substrate 100.

Then, an insulation layer 130 may be formed on a whole surface of the substrate 100 including the gate patterns and the impurity regions. For example, a plasma oxide or an undoped silicate glass may be deposited onto the substrate 100 including the gate patterns 120a, 120b and 120c along a surface profile, thereby forming a protection layer 130a on the substrate 100. Thus, the protection layer 130a may include a gap space between the neighboring SSTs and the neighboring GSTs. Then, a tetra ethyl orthosilicate (TEOS) may be deposited onto the protection layer 130a to a sufficient thickness to fill up the gap space by a plasma-enhanced chemical vapor deposition (PECVD) process, thereby forming a Plasma-Enhanced TetraEthylOrthoSilicate (PETEOS) layer on the protection layer 130a. Then, an upper portion of the PETEOS layer may be planarized by a planarization process such as a CMP process, thereby forming a flat layer 130b on the protection layer 130a. Thus, the insulation layer 130 may include the protection layer 130a and the flat layer 130b and the gate patterns 120a, 120b and 120c may be electrically insulated from one another by the insulation layer 130 and be covered with the insulation layer 130.

Then, the first insulation layer 130 may be partially removed from the substrate 100 by a first etching process, thereby forming a first contact hole 132 through which the active regions Ar between the neighboring GSTs and the device isolation layer 103 between the active regions Ar may be exposed. That is, the first contact hole 132 may extend in a second direction vertical to the active region in parallel with the GSL and thus the active regions Ar and the device isolation layers 103 between the neighboring active regions Ar may be exposed through the first contact hole 132 in the second direction. An implantation area may be formed on the active region Ar exposed through the first contact hole 132 by an ion implantation process and a cell source region and a series of the implantation areas may form a conductive line that may be in parallel with the GSL.

A first conductive layer may be formed on the insulation layer 130 to a sufficient thickness to fill up the first contact hole 132 and then may be partially removed from the insulation layer 130 by a planarization process such as a CMP process and an etch-back process until an upper surface of the insulation layer 130 may be exposed, thereby forming a common source line 134 in the first contact hole 132. Thus, an upper surface of the CSL 134 may be coplanar with the upper surface of the insulation layer 130. For example, the first conductive layer may comprise doped polysilicon.

Figure 6A:
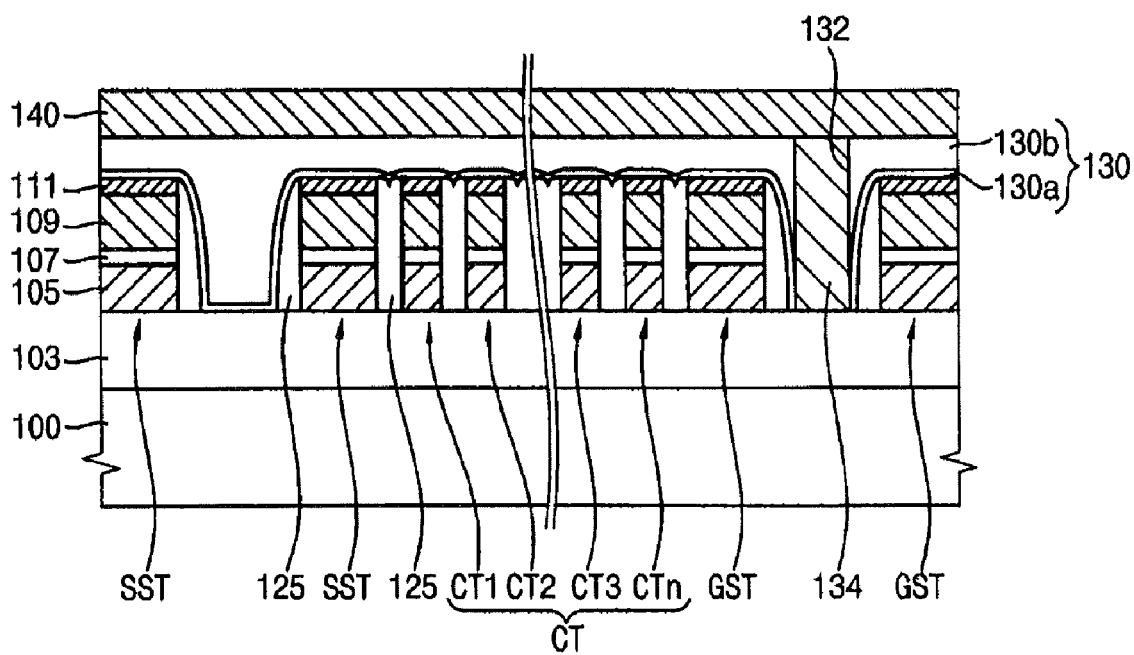
Figure 6B:
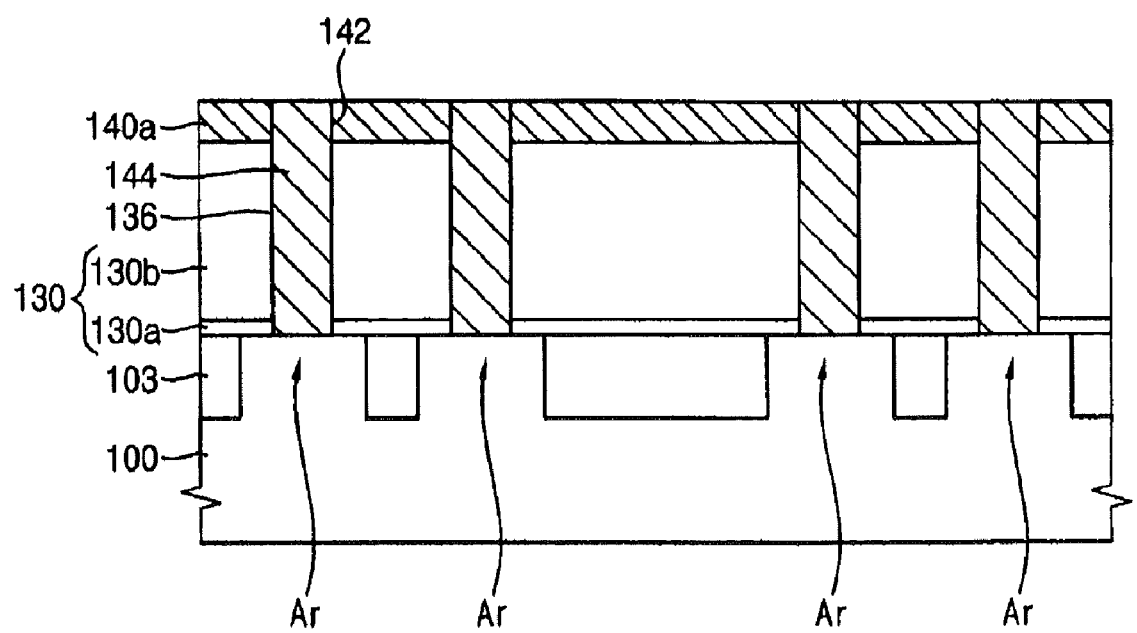

Referring to FIGS. 3, 6A and 6B, a first insulation interlayer 140 may be formed on the insulation layer 130 to a sufficient thickness to cover the CSL 134. The first insulation interlayer 140 may electrically insulate the CSL 134 from a contact plug that is to be formed hereinafter.

Then, the first insulation interlayer 140 and the insulation layer 130 under the first insulation interlayer 140 may be sequentially etched off from the substrate 100 by a second etching process, thereby forming a first via hole 142 in the first insulation interlayer 140 and a second contact hole 136 in the insulation layer 130. The first via hole 142 and the second contact hole 136 may be communicated with each other and the active region Ar between the neighboring SSLs may be exposed through the first via hole 142 and the second contact hole 136. Hereinafter, the insulation interlayer 140 including the first via hole 142 may be refereed to as first insulation interlayer pattern and be denoted as reference numeral 140a.

A second conductive layer (not shown) may be formed on the first insulation interlayer pattern 140a to a sufficient thickness to fill up the second contact hole 136 and the first via hole 142 and then may be partially removed from the first insulation interlayer pattern 140a by a planarization process until an upper surface of the first insulation interlayer pattern 140a, thereby forming a contact plug 144 in the second contact hole 136 and the first via hole 142. Thus, an upper surface of the contact plug 144 may be coplanar with the upper surface of the first insulation interlayer pattern 140a.

In the present example embodiment, the second conductive layer may include a polysilicon layer, a metal layer comprising tungsten (W) and aluminum (Al) and a multi-layer having the polysilicon layer and the metal layer. Particularly, when the second conductive layer may include the tungsten layer, a barrier layer (not shown) may be further formed between the tungsten layer and the first insulation interlayer pattern 140a and between the tungsten layer and the substrate 100, thereby reducing a contact resistance between the contact plug 144 and the substrate 100 and preventing the diffusion of the source gases into the first insulation interlayer pattern 140a in a tungsten deposition process. For example, the barrier layer may comprise titanium (Ti) and/or titanium nitride (TiN).

Figure 7A:
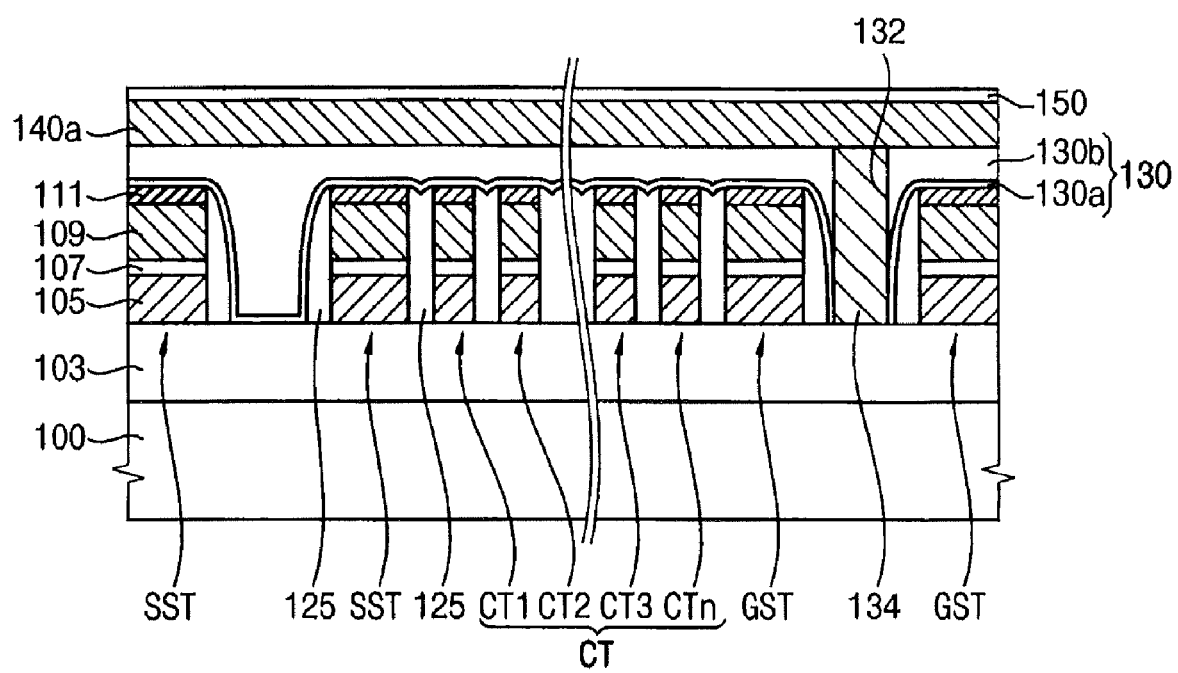
Figure 7B:
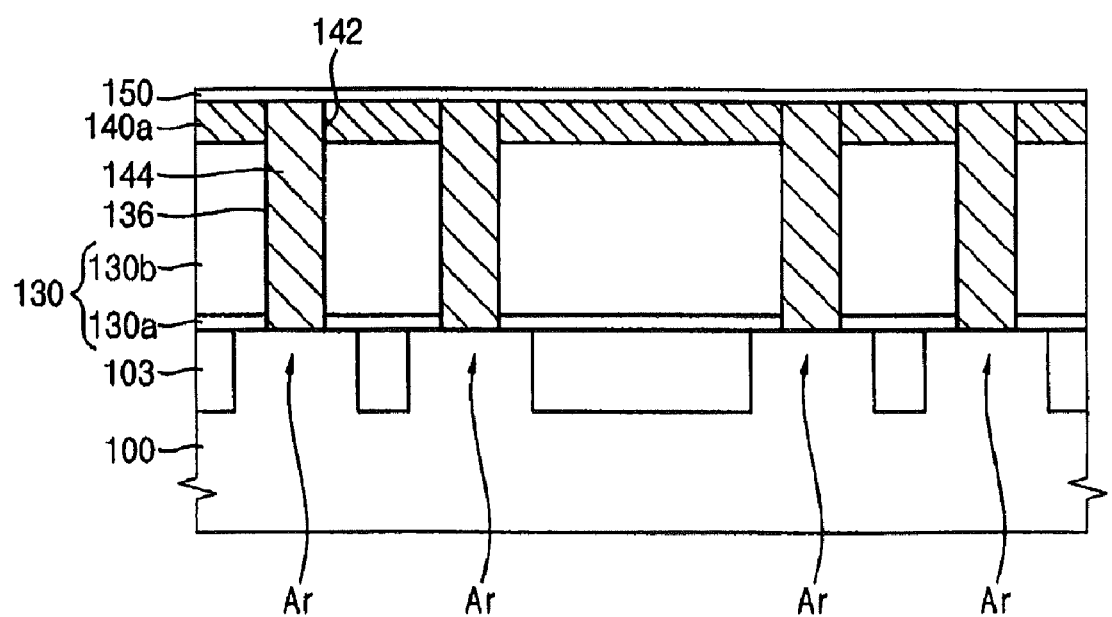

Referring to FIGS. 3, 7A and 7B, an etch stop layer 150 may be formed on the first insulation interlayer pattern 140a to cover the contact plug 144. The etch stop layer 150 may have an etch selectivity with respect to a second insulation pattern 160a that is to be formed in a subsequent process.

Figure 8A:
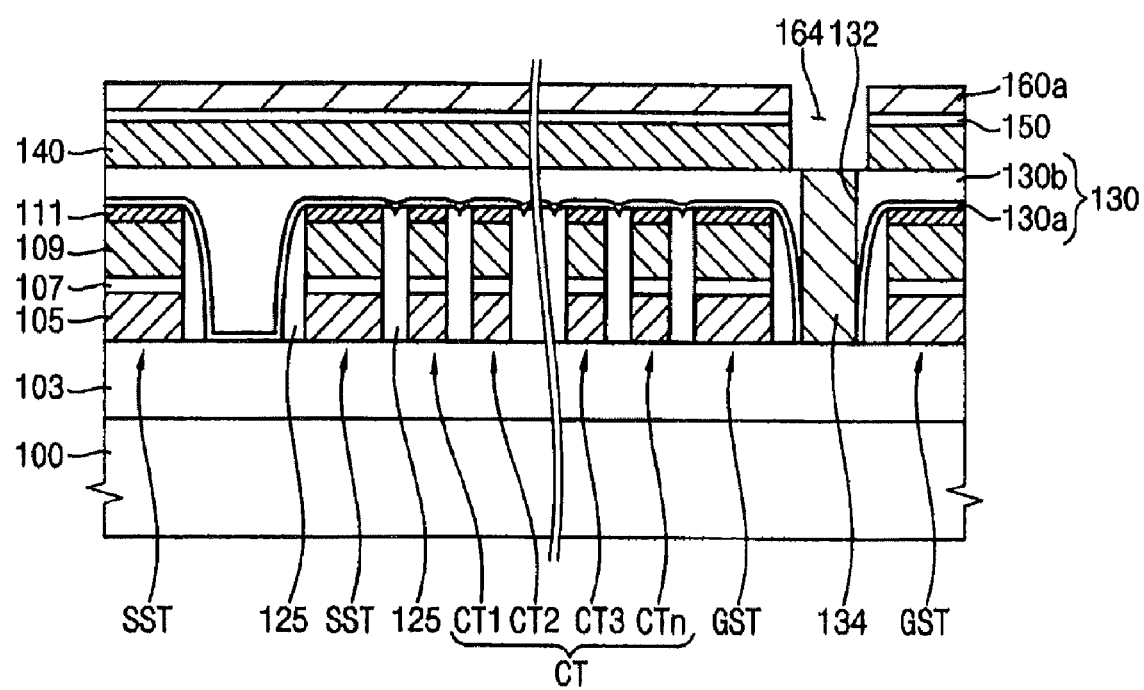
Figure 8B:
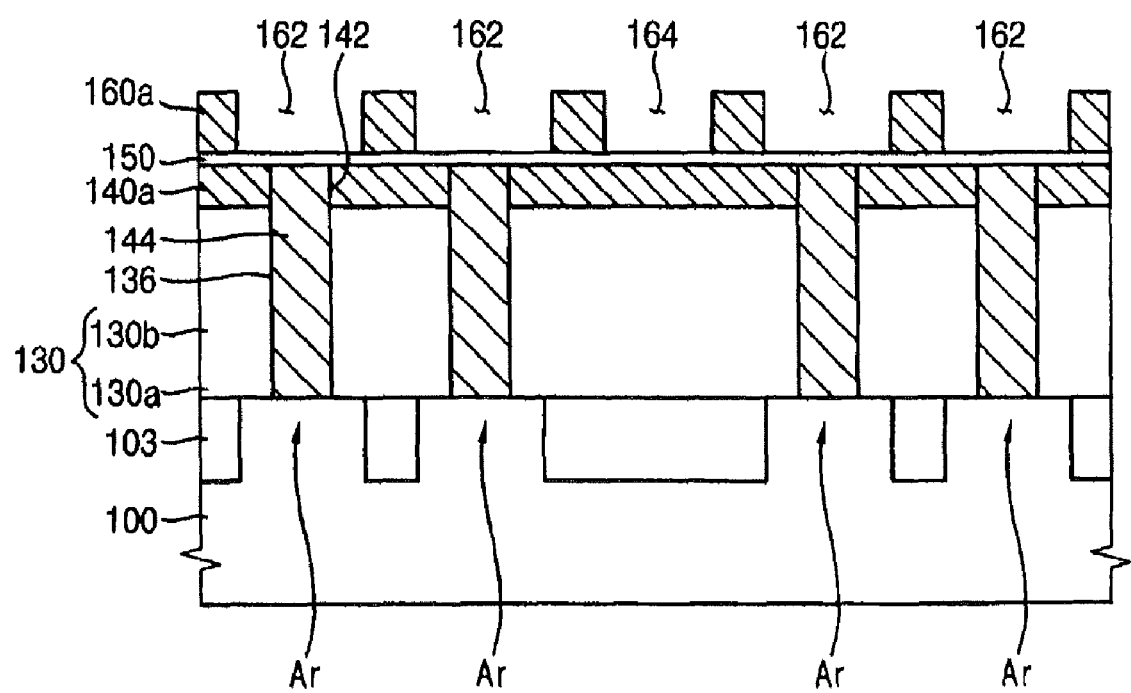

Referring to FIGS. 3, 8A and 8B, a second insulation interlayer may be formed on the etch stop layer 150 and then may be partially etched off from the etch stop layer 150, thereby forming the second insulation interlayer pattern 160a including a first trench 162 and a second trench 164. The contact plug 144 may be exposed through the first trench 162 and the CSL 134 may be exposed through the second trench 164.

For example, the second insulation interlayer may comprise an oxide like the first insulation interlayer 140. Examples of the oxide may include boron phosphorus silicate glass (BPSG), phosphorus silicate glass (PSG), fluorinated silicate glass (FSG), tetra ethyl orthosilicate deposited by plasma enhanced CVD (PE-TEOS) and undoped silicate glass (USG), etc. These may be used alone or in combinations thereof. In the present example embodiment, both of the first and the second insulation interlayer may include a PETEOS layer. For example, the PECVD process may be performed on the etch stop layer 150 using tetra etoxy silane (Si(OC2H5)4) gases and oxygen (O2) or ozone (O3) gases as the source gases, thereby forming the PETEOS layer on the etch stop layer 150 as the second insulation interlayer. Otherwise, the second insulation interlayer may be different from the first insulation interlayer 140, as would be known to one of the ordinary skill in the art.

The second insulation interlayer may be additionally removed from the etch stop layer 150 in a subsequent etching process for forming the first and the second trenches and a subsequent planarization process for forming the cell metal wiring, and thus the second insulation interlayer may be formed to a sufficient thickness to compensate for the additional loss in the above subsequent etching process and the planarization process.

For example, the second insulation interlayer and the etch stop layer 150 may be partially etched off by a single damascene process, thereby forming the first and the second trenches 162 and 164.

Particularly, a hard mask pattern 31a in FIG. 1G may be formed on the second insulation interlayer by the double patterning process using a single mask pattern that may be described in detail with reference to FIGS. 1A to 1G, and then a single damascene process may be performed onto the second insulation interlayer using the hard mask pattern 31a as an etching mask. Accordingly, the second insulation interlayer and the etch stop layer 150 may be patterned to have the first trench 162 through which the contact plug 144 may be exposed and the second trench 164 through which the CSL 134 may be exposed. In such a case, the first and the second trenches 162 and 164 may have a width larger than that of the first and the second via holes 142 and 146, respectively. Thus, the contact plug 144 may make sufficient contact with a bit line and the CSL 134 may make sufficient contact with a cell metal wiring.

A peripheral trench (not shown) may be formed in the second insulation layer simultaneously with the first and second trenches 162 and 164 by the same damascene process. A peripheral wiring structure through which a driving signal may be transferred to the cell metal wiring may be formed in the peripheral trench on a peripheral region of the substrate 100. Thus, various trenches for the peripheral wiring structure, the bit line and the cell metal wiring, which may have respective widths different from one another, may be simultaneously in the same double patterning process using a single mask pattern, thereby remarkably increasing process efficiency of the flash memory device.

Particularly, various patterns having different widths may be simultaneously formed at different regions of the substrate 100 by a single patterning process, and thus process failures caused by misalignment of the patterns may be significantly reduced as compared with the conventional patterns that have been formed individually by a respective patterning process. For example, when a plurality of bit lines may be formed in a cell region of a NAND flash memory device, the NAND flash memory device may need a wiring separation pattern for node separation of the bit lines in the cell region. Since the wiring separation pattern may have a line width much larger than that of the bit line, the bit lines and each line of the wiring separation pattern is likely to be misaligned with each other in case that the bit lines and the wiring separation pattern may be individually formed by a respective patterning process. In such a case, the node separation of the bit lines may be insufficient and thus a wiring failure such as electric short between neighboring bit lines may be found in the flash memory device. However, according to the present example embodiment, the bit line and the wiring separation pattern may be formed in the cell region simultaneously with each other by the same patterning process using a single singe mask pattern, thereby sufficiently preventing the wiring failures caused by the misalignment of the bit line and the wiring separation pattern.

Figure 9A:
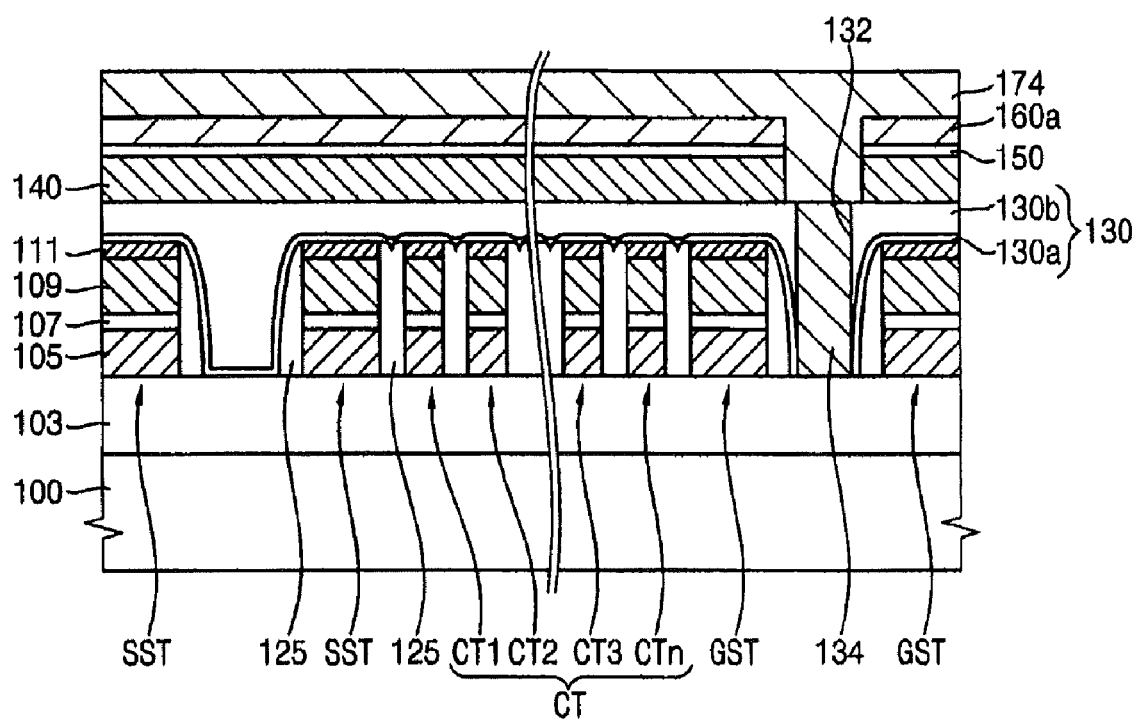
Figure 9B:
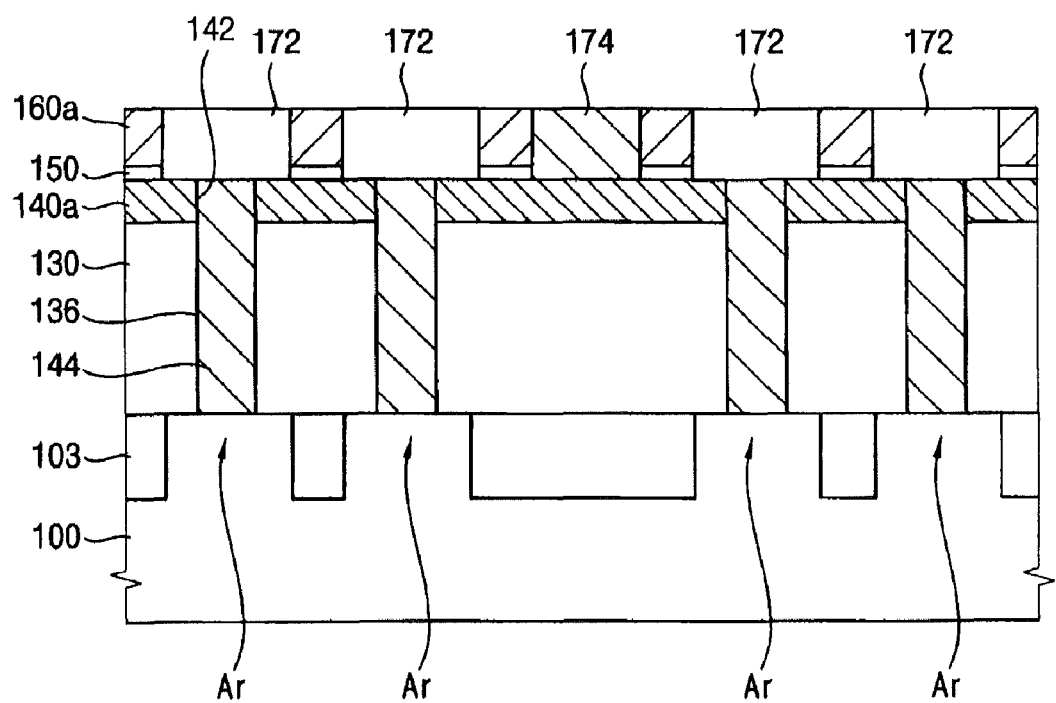

Referring to FIGS. 3, 9A and 9B, the bit line 172 and the cell metal wiring 174 may be formed in the first and second trenches 162 and 164, respectively.

For example, conductive materials may be deposited onto the second insulation interlayer pattern 160a including the first and the second trenches 162 and 164 to a sufficient thickness to fill up the first and the second trenches 162 and 164, thereby forming a third conductive layer (not shown) on the second insulation interlayer pattern 160a. The third conductive layer may comprise a metal having a good electric conductivity such as copper (Cu), tungsten (W) and aluminum (Al). In the present example embodiment, the third conductive layer may comprise copper (Cu).

A planarization process such as a CMP process and an etch-back process may be performed against the third conductive layer until an upper surface of the second insulation interlayer pattern 160a may be exposed, and thus an upper portion of the third conductive layer may be removed from the second insulation interlayer pattern 160a and merely remain in the first and second trenches 162 and 164, thereby forming the conductive line 170 of the flash memory device 900. The conductive line 170 may include a bit line 172 making contact with the contact plug 144 and extending in the first direction over the active region Ar and a cell metal wiring 174 making contact with the CSL 134 and extending in the first direction over the device isolation layer 103. Since the contact plug 144 and the CSL 134 may be electrically insulated from each other by the first insulation interlayer pattern 140a, the bit line 172 and the CSL 134 may also be electrically insulated from each other.

According to the exemplarily method of manufacturing the flash memory device, various patterns having different widths may be formed simultaneously with each other by the same double patterning process using a single mask pattern, thereby preventing wiring failures caused by the misalignment between the patterns and improving process efficiency. Particularly, when the pattern in the cell region of the substrate needs to be much finer according to the recent CD reduction, the reduced gap space and line width of the fine pattern in the cell region may be easily and accurately controlled merely by variation of the width of the spacer pattern in the double patterning process, thereby increasing the distribution density of the wiring structure in the cell region of the flash memory device.

According to the example embodiments of the present inventive concept, at least two kinds of patterns having different line width may be formed in different areas of the substrate, respectively, by a double patterning process using a single mask pattern, thereby preventing the misalignment of the patterns and improving a process efficiency for manufacturing the semiconductor device. Particularly, the bit lines and the peripheral metal wirings of a flash memory device may be formed simultaneously with each other by a double patterning process using a single photolithography process. In addition, a bit line pattern and a wiring separation pattern may be formed simultaneously in the same double patterning process, thereby preventing the wiring failures caused by misalignments of the bit line pattern and the wiring separation pattern.

A memory system including the flash memory device of the present example embodiment may be applied in various electronic equipment. For example, the memory system including the flash memory device according to some embodiments may be applied to a personal digital assistant (PDA), a personal computer system, a wireless telephone, a mobile phone such as a cellular phone and a smart phone, a digital music player, a memory card, and/or various other devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of fabricating an integrated circuit device, the method comprising:

providing a substrate including an insulation layer and a hard mask layer thereon;

forming first and second preliminary mask structures on the hard mask layer in respective first and second regions of the substrate, the second preliminary mask structure having a greater width than the first preliminary mask structure;

forming spacers on opposing sidewalls of the first and second preliminary mask structures, wherein each of the first and second preliminary mask structures comprises a sacrificial pattern and a dummy pattern thereon having an etch selectivity relative to the sacrificial pattern, wherein forming the first and second preliminary mask structures comprises:

providing a sacrificial layer and a dummy layer on the hard mask layer;

patterning the dummy layer using respective masks to define the respective dummy patterns of the first and second preliminary mask structures in the first and second regions; and isotropically etching the sacrificial layer using the respective dummy patterns as masks to define the respective sacrificial patterns of the first and second preliminary mask structures and such that a greater portion of the dummy pattern of the first preliminary mask structure is removed as compared to the dummy pattern of the second preliminary mask structure, and wherein forming the spacers comprises:

conformally forming a spacer layer on upper surfaces and on the opposing sidewalls of the first and second preliminary mask structures; and anisotropically etching the spacer layer on the upper surfaces of the first and second preliminary mask structures to remove spacer layer therefrom and to remove the dummy pattern from the first preliminary mask structure while maintaining at least a portion of the dummy pattern of the second preliminary mask structure;

selectively removing the first preliminary mask structure from between the spacers in the first region such that the second preliminary mask structure remains between the spacers in the second region;

etching the hard mask layer using the spacers and the second preliminary mask structure as a mask to define a first mask pattern comprising the opposing sidewall spacers with a void therebetween in the first region and a second mask pattern comprising the opposing sidewall spacers and the second preliminary mask structure therebetween in the second region;

patterning the insulation layer using the first mask pattern as a mask to define a first trench in the first region and using the second mask pattern as a mask to define a second trench in the second region having a greater width than the first trench; and forming first and second conductive patterns in the first and second trenches, respectively.

2. The method of claim 1, wherein the sacrificial layer comprises at least one of a silicon-containing layer and a carbon-containing layer.

3. The method of claim 1, wherein the dummy patterns in the first and second regions are formed by a single patterning process and the sacrificial patterns in the first and second regions are formed by a single patterning process.

4. The method of claim 1, wherein selectively removing the first preliminary mask structure comprises:

after anisotropically etching the spacer layer, selectively etching the first and second preliminary mask structures using the portion of the dummy pattern of the second preliminary mask structure as a mask to remove the sacrificial pattern of the first preliminary mask structure without substantially removing the second preliminary mask structure.

5. The method of claim 1, wherein a plurality of the first preliminary mask structures is formed on the first region, and wherein the spacers have a width that is less than one half of a difference between a pitch of the first preliminary mask structures and the width of the first preliminary mask structures.

6. The method of claim 1, wherein a plurality of the first conductive patterns are formed in respective first trenches in the insulation layer in the first region, and wherein the spacers have a width that is less than about half of a width of the first conductive patterns.

7. The method of claim 1, wherein the first region comprises a memory cell active region, and wherein the second region comprises a peripheral circuit region.

8. The method of claim 1, wherein the insulation layer comprises a lower insulation layer, an etch stop layer, and an upper insulation layer sequentially stacked on the substrate.

9. A method of manufacturing a non-volatile memory device, comprising:

forming a plurality of lower conductive structures and an insulation layer covering the lower conductive structures on a substrate having a number of active regions extending in a first direction, the lower conductive structures including a string selection line (SSL), a ground selection line (GSL) and a number of word lines (WL) between the SSL and the GSL that extend parallel in a second direction perpendicular to the first direction and including a common source line (CSL) making contact with a ground selection transistor in the GSL and a contact plug making contact with a string selection transistor in the SSL;

forming a first hard mask pattern having a first width and a second hard mask pattern having a second width larger than the first width on the insulation layer by a spacer patterning process using a single photolithography process;

patterning the insulation layer using the first and the second hard mask patterns, thereby forming an insulation pattern having a first trench through which the contact plug is exposed and a second trench through which the CSL is exposed; and forming conductive lines in the first and the second trenches, the conductive lines including a bit line arranged in the first trench and making contact with the contact plug and a metal wiring arranged in the second trench and making contact with the CSL.

10. The method of claim 9, wherein forming the first and the second hard mask patterns includes:

sequentially stacking a hard mask layer, a sacrificial layer and a variable mask layer on the insulation layer;

patterning the variable mask layer and the sacrificial layer, thereby forming a first preliminary pattern having the first width and including a first sacrificial pattern and a first variable mask pattern and a second preliminary pattern having the second width and including a second sacrificial pattern and a second variable mask pattern;

forming first and second spacers on sidewalls of the first and the second preliminary patterns simultaneously with each other;

removing the first preliminary pattern from the hard mask layer, so that the first spacer remain in a first area of the substrate and both of the second spacer and the second preliminary pattern remain in a second area of the substrate; and partially removing the hard mask layer by an etching process using the first spacer, the second spacer and the second preliminary pattern as an etching mask.

11. The method of claim 10, wherein the first and the second sacrificial patterns are formed by an etching process using the first and the second variable mask patterns, respectively, wherein an etching rate in the first area is greater than in the second area of the substrate, so that a residual of the second variable mask pattern in the second area is higher than a residual of the first variable mask pattern in the first area.

12. The method of claim 10, wherein the first spacer is formed on a sidewall of the first sacrificial pattern and the second spacer is formed on sidewalls of both of the second sacrificial pattern and the second variable mask pattern, so that the second sacrificial pattern is protected from being etched by the second variable mask pattern in an etching process for removing the first sacrificial pattern.

13. The method of claim 9, wherein patterning the insulation layer is performed by a single damascene process using the first and the second hard mask patterns as an etching mask.

14. The method of claim 13, wherein the first trench has a first trench width corresponding to a gap distance of the first hard mask pattern shaped into a line and the second trench has a second trench width corresponding to a gap distance of the second hard mask pattern shaped into a line, and a plurality of the first trenches is arranged to be spaced apart from each other by a first trench gap distance corresponding to the first width of the first hard mask pattern and a plurality of the second trenches is arranged to be spaced apart from each other by a second trench gap distance corresponding to the second width of the second hard mask pattern.

15. The method of claim 13, wherein the CSL in a cell region of the substrate is exposed through the first trench and the contact plug in a peripheral region of the substrate is exposed through the second trench.

16. The method of claim 9, wherein the insulation layer includes any one material selected from the group consisting of boron phosphorus silicate glass (BPSG), phosphorus silicate glass (PSG), fluorinated silicate glass (FSG), tetra ethyl orthosilicate deposited by a plasma enhanced chemical vapor deposition process (PE-TEOS) and undoped silicate glass (USG).

17. A method of manufacturing a non-volatile memory device, comprising:

forming a string selection line (SSL), a ground selection line (GSL) and a number of word lines (WL) between the SSL and the GSL extending parallel in a second direction on a substrate that has a number of active regions extending in a first direction perpendicular to the second direction;

forming an insulation layer on the substrate and on the string selection line, the ground selection line, and the word lines therebetween, the insulation layer comprising a first insulation interlayer, an etch stop layer, and a second insulation interlayer thereon and including a conductive plug extending therethrough to contact an active region;

forming a hard mask layer on the second insulation interlayer;

forming first and second preliminary mask structures on the hard mask layer in a cell region and a peripheral region of the substrate, respectively, the second preliminary mask structure having a greater width than the first preliminary mask structure;

forming spacers on opposing sidewalls of the first and second preliminary mask structures, wherein each of the first and second preliminary mask structures comprises a sacrificial pattern and a dummy pattern thereon having an etch selectivity relative to the sacrificial pattern, wherein forming the first and second preliminary mask structures comprises:

providing a sacrificial layer and a dummy layer on the hard mask layer;

patterning the dummy layer using respective masks to define the respective dummy patterns of the first and second preliminary mask structures in the first and second regions; and isotropically etching the sacrificial layer using the respective dummy patterns as masks to define the respective sacrificial patterns of the first and second preliminary mask structures and such that a greater portion of the dummy pattern of the first preliminary mask structure is removed as compared to the dummy pattern of the second preliminary mask structure, and wherein forming the spacers comprises:

conformally forming a spacer layer on upper surfaces and on the opposing sidewalls of the first and second preliminary mask structures; and anisotropically etching the spacer layer on the upper surfaces of the first and second preliminary mask structures to remove spacer layer therefrom and to remove the dummy pattern from the first preliminary mask structure while maintaining at least a portion of the dummy pattern of the second preliminary mask structure;

selectively removing the first preliminary mask structure from between the spacers in the cell region such that the second preliminary mask structure remains between the spacers in the peripheral region;

etching the hard mask layer using the spacers and the second preliminary mask structure as a mask to define a first mask pattern comprising the opposing sidewall spacers with a void therebetween in the cell region and a second mask pattern comprising the opposing sidewall spacers and the second preliminary mask structure therebetween in the peripheral region;

patterning the insulation layer using the first mask pattern as a mask to define a first trench in the cell region that exposes the conductive plug and using the second mask pattern as a mask to define a peripheral trench in the peripheral region having a greater width than the first trench; and forming a bit line in the first trench, and forming a peripheral wiring structure in the peripheral trench.

* * * * *